(12) United States Patent
Ker et al.

(10) Patent No.: US 7,394,630 B2
(45) Date of Patent: Jul. 1, 2008

(54) ELECTROSTATIC DISCHARGE PROTECTION DEVICE FOR MIXED VOLTAGE INTERFACE

(76) Inventors: Ming-Dou Ker, Bldg. 51, 195, Chung Hsing Rd., Sec. 4, Chutung, Hsinchu (TW); Kuo-Chun Hsu, Bldg. 51, 195, Chung Hsing Rd., Sec. 4, Chutung, Hsinchu (TW); Hsin-Chin Jiang, Bldg. 51, 195, Chung Hsing Rd., Sec. 4, Chutung, Hsinchu (TW)

( * ) Notice: Subject to any disclaimer, the term of this patent is extended or adjusted under 35 U.S.C. 154(b) by 384 days.

(21) Appl. No.: 10/268,756

(22) Filed: Oct. 11, 2002

(65) Prior Publication Data

US 2004/0070900 A1 Apr. 15, 2004

(51) Int. Cl.
H02H 3/22 (2006.01)
(52) U.S. Cl. .......................................... 361/56; 361/111
(58) Field of Classification Search ............. 361/56–58, 361/91, 111, 91.1; 257/401, 206, 355–360, 257/403; 438/279
See application file for complete search history.

(56) References Cited

U.S. PATENT DOCUMENTS

| | | | | | |
|---|---|---|---|---|---|
| 5,151,762 | A | * | 9/1992 | Uenishi et al. | 257/133 |
| 5,565,375 | A | * | 10/1996 | Hiser et al. | 438/213 |
| 5,612,566 | A | * | 3/1997 | Williams | 257/402 |
| 5,623,156 | A | * | 4/1997 | Watt | 257/355 |
| 5,625,280 | A | * | 4/1997 | Voldman | 323/284 |
| 5,716,866 | A | * | 2/1998 | Dow et al. | 438/286 |
| 5,780,897 | A | | 7/1998 | Krakauer | |
| 5,831,316 | A | * | 11/1998 | Yu et al. | 257/401 |
| 5,956,219 | A | * | 9/1999 | Maloney | 361/56 |
| 6,140,375 | A | * | 10/2000 | Nagahama et al. | 516/73 |
| 6,143,610 | A | * | 11/2000 | Wen et al. | 438/275 |
| 6,365,932 | B1 | * | 4/2002 | Kouno et al. | 257/341 |
| 6,369,994 | B1 | * | 4/2002 | Voldman | 361/56 |
| 6,466,423 | B1 | * | 10/2002 | Yu | 361/56 |
| 6,469,560 | B1 | * | 10/2002 | Chang et al. | 327/310 |
| 6,529,035 | B2 | * | 3/2003 | Schroeder et al. | 326/26 |
| 6,573,765 | B2 | * | 6/2003 | Bales et al. | 327/108 |
| 6,638,801 | B2 | * | 10/2003 | Manabe | 438/179 |
| 6,657,835 | B2 | * | 12/2003 | Ker et al. | 361/56 |
| 6,744,107 | B1 | * | 6/2004 | Ker et al. | 257/401 |
| 6,809,386 | B2 | * | 10/2004 | Chaine et al. | 257/368 |
| 6,812,531 | B1 | * | 11/2004 | Baldi et al. | 257/390 |
| 6,862,160 | B2 | * | 3/2005 | Maloney et al. | 361/56 |
| 6,867,957 | B1 | * | 3/2005 | Tong et al. | 361/56 |
| 6,906,387 | B1 | * | 6/2005 | Reese et al. | 257/355 |
| 6,977,408 | B1 | * | 12/2005 | Lin et al. | 257/315 |
| 2004/0041215 | A1 | * | 3/2004 | Chaine et al. | 257/401 |

FOREIGN PATENT DOCUMENTS

JP 07-263689 * 10/1995

* cited by examiner

*Primary Examiner*—Danny Nguyen

(57) ABSTRACT

An electrostatic discharge protection circuit that includes at least two transistors connected in a stacked configuration, a first diffusion region of a first dopant type shared by two adjacent transistors, and a second diffusion region of a second dopant type formed in the first diffusion region. A substrate-triggered site is induced into the device structure of the stacked transistors to improve ESD robustness and turn-on speed. An area-efficient layout to realize the stacked transistors is proposed. The stacked transistors may be implemented in ESD protection circuits with a mixed-voltage I/O interface, or in integrated circuits with multiple power supplies. The stacked transistors are fabricated without using a thick-gate mask.

56 Claims, 21 Drawing Sheets

ELECTROSTATIC DISCHARGE PROTECTION DEVICE FOR MIXED VOLTAGE INTERFACE

FIELD OF THE INVENTION

This invention pertains in general to a semiconductor device and, more particularly, to a substrate-triggered semiconductor device for electrostatic discharge protection and a method thereof.

BACKGROUND OF THE INVENTION

In deep sub-micron semiconductor technology, it is a trend to shrink device dimensions, include more functions in a device and decrease power consumption. As more functions are integrated into a chip, a chip often has more power pins to supply sufficient current for circuit operations. These power pins may support different voltage levels of a high-state voltage source VCC or VDD of a chip in various applications. For example, in typical 0.35 μm CMOS technology, the VCC for a chip with a gate-oxide thickness of 70 angstroms has been scaled down to 3.3V. However, the VCC for a chip with a gate-oxide thickness of 140 angstroms may be as high as 5V. The environment in which chips have different power supplies with different voltage levels has been called a mixed voltage interface.

In designing an electrostatic discharge (ESD) protection circuit for a mixed voltage interface, two issues are often taken into consideration: gate oxide reliability and direct current (DC) leakage. However, conventional ESD protection designs for a mixed voltage interface, for example, a 3.3V/1.8V interface, may have some disadvantages, as will be explained below.

FIG. 1 shows a conventional ESD protection circuit using a gate-grounded NMOS and a gate-shorted-to-VDD PMOS to clamp an incoming signal at one diode voltage drop above 1.8V, and conduct an excessive DC leakage current from an input pad to the 1.8V VDD line when a 3.3V signal is applied to the input pad. Such a circuit may have a gate oxide reliability problem because the thin-gate oxide of the gate-grounded NMOS has to sustain the overstress as the drain voltage is 3.3V. To solve the problem, a thick-gate NMOS may be used but will increase the manufacturing cost.

FIG. 2 is a reproduction of FIG. 2 of U.S. Pat. No. 5,780,897 (the '897 patent) to Krakauer, entitled "ESD Protection Clamp for Mixed Voltage I/O Stages Using NMOS Transistors." The '897 patent describes an electrostatic discharge protection device including two thin-gate NMOS transistors stacked in a cascode configuration. The top transistor of the stacked NMOS includes a drain terminal coupled to an input/output (I/O) pad, a gate (top gate) coupled to a voltage source VDD, and a source coupled to the drain of the bottom transistor of the stacked. That is, the source of the top transistor and the drain of the bottom transistor share one and the same N+ diffusion region. During an ESD event, a parasitic lateral NPN transistor in the ESD protection device is triggered to conduct an ESD current.

FIG. 3 is a reproduction of FIG. 2 of U.S. Pat. No. 5,956,219 (the '219 patent) to Maloney, entitled "High Voltage Power Supply Clamp Circuitry for Electrostatic Discharge (ESD) Protection." The '219 patent describes an ESD clamp circuit including two thin-gate PMOS transistors without using the thick-gate transistor. In a CMOS process, the thick-gate transistor needs an extra mask in the manufacturing process, which increases the fabrication cost. During normal circuit operating conditions, at least one of the two PMOS transistors is switched off to stop any leakage current. During an ESD event, the two PMOS transistors are switched on to conduct an ESD current. For deep submicron applications, as shown in FIGS. 3 and 4 of the '219 patent, three or more transistors are employed in the ESD clamp circuit to sustain a high power supply voltage.

FIG. 4 is a diagram showing the relationship between a second breakdown current ($It_2$) and a substrate current ($I_{sub}$) in a substrate-triggered ESD protection device for different channel widths (W). Referring to FIG. 4, $It_2$ increases as $I_{sub}$ increases. Based on this property, substrate-triggered devices have been developed for ESD protection. To apply the substrate-triggered technique to the thin-gate ESD protection devices, however, the chip layout area would have to be increased to accommodate an additional substrate trigger site. It is desired to use the substrate-triggered technique in a thin-gate ESD protection device without increasing the layout area.

SUMMARY OF THE INVENTION

Accordingly, the present invention is directed to ESD protection devices that obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the methods particularly pointed out in the written description and claims thereof, as well as the appended drawings.

To achieve these and other advantages, and in accordance with the purpose of the invention as embodied and broadly described, there is provided an electrostatic discharge protection circuit device that includes at least two transistors connected in a cascode configuration, a first diffusion region of a first dopant type shared by two adjacent transistors, and a second diffusion region of a second dopant type formed in the first diffusion region.

In one aspect of the present invention, each transistor has a gate structure and the second diffusion region overlaps a portion of the gate structure.

In another aspect of the present invention, the ESD circuit device further includes a third diffusion region of the first dopant type formed between the first and the second diffusion regions.

Also in accordance with the present invention, there is provided an integrated circuit device for electrostatic protection that includes a semiconductor substrate, a plurality of gates formed over the substrate, a first diffusion region of a first dopant type formed between two adjacent gates, and at least a second diffusion region of a second dopant type formed in the first diffusion region.

In one aspect of the present invention, a plurality of second diffusion regions are formed in the first diffusion region and at least one of the second diffusion regions is spaced apart from other ones of the second diffusion regions.

In another aspect of the present invention, a plurality of second diffusion regions are formed in the first diffusion region and at least one of the second diffusion regions is contiguous with another one of the second diffusion regions.

Still in accordance with the present invention, there is provided an integrated circuit for electrostatic discharge protection in a mixed voltage interface. The integrated circuit includes a signal pad for receiving an electrostatic signal, a clamping device for providing electrostatic protection between a first voltage source and a second voltage source, and a detection circuit responsive to the electrostatic signal for triggering the clamping device to direct the electrostatic signal to the second voltage source, wherein the clamping device includes at least two transistors connected in a cascode configuration, a first diffusion region of a first dopant type shared by two adjacent transistors, and a second diffusion region of a second dopant type formed in the first diffusion region.

Yet still in accordance with the present invention, there is provided with a method for protecting a mixed voltage interface from electrostatic discharge. The method includes providing a signal pad for receiving an electrostatic signal, providing a clamping device that includes at least two transistors connected in a cascode configuration, a first diffusion region of a first dopant type shared by two adjacent transistors, and a second diffusion region of a second dopant type formed in the first diffusion region, and providing a detection circuit responsive to the electrostatic signal for triggering a p-n junction between the first diffusion region and the second diffusion region of the clamping device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 5A:
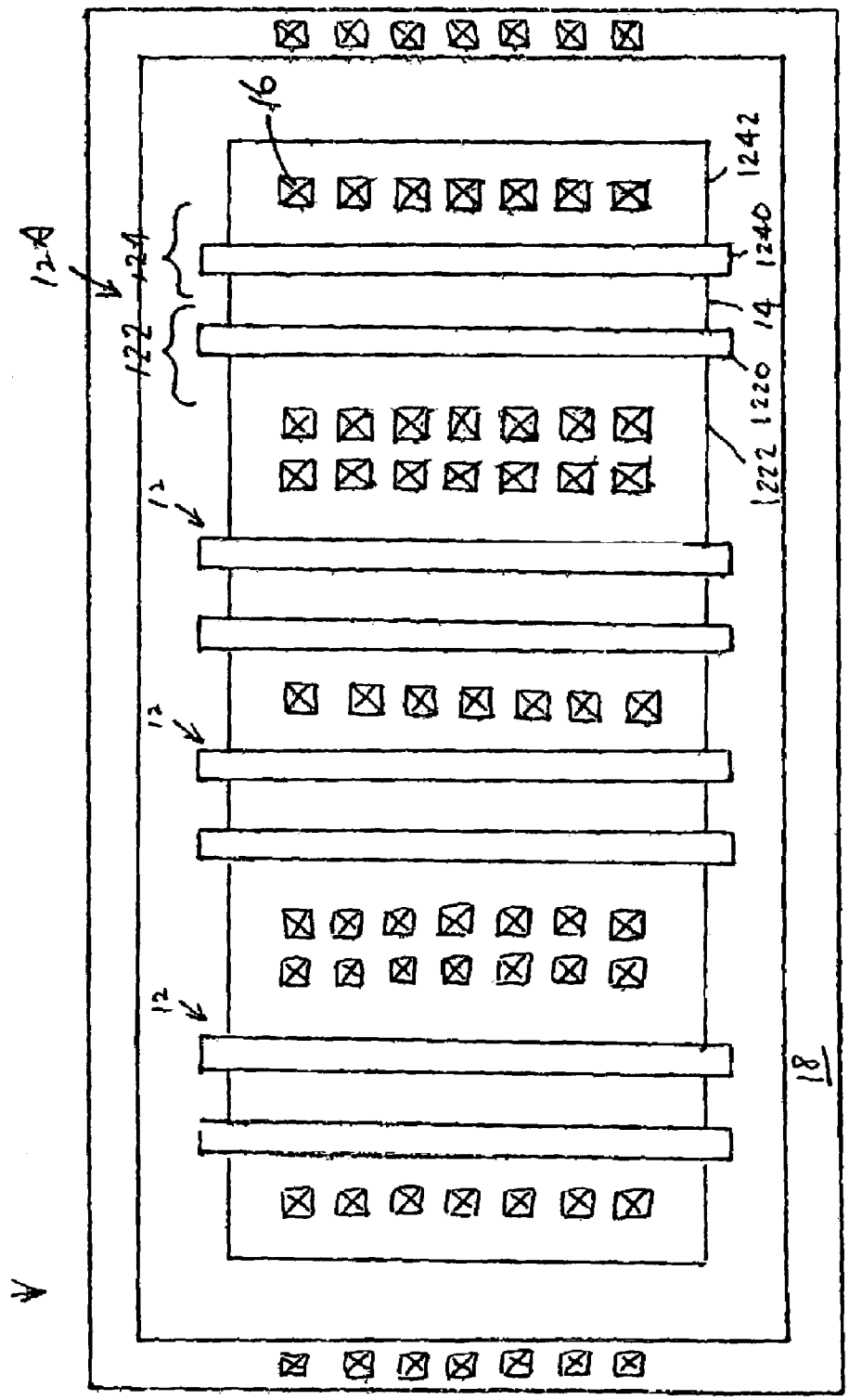
FIGS. 5A and 5B respectively show a layout and a cross-sectional view of a conventional stacked NMOS transistor structure.
Figure 5B:
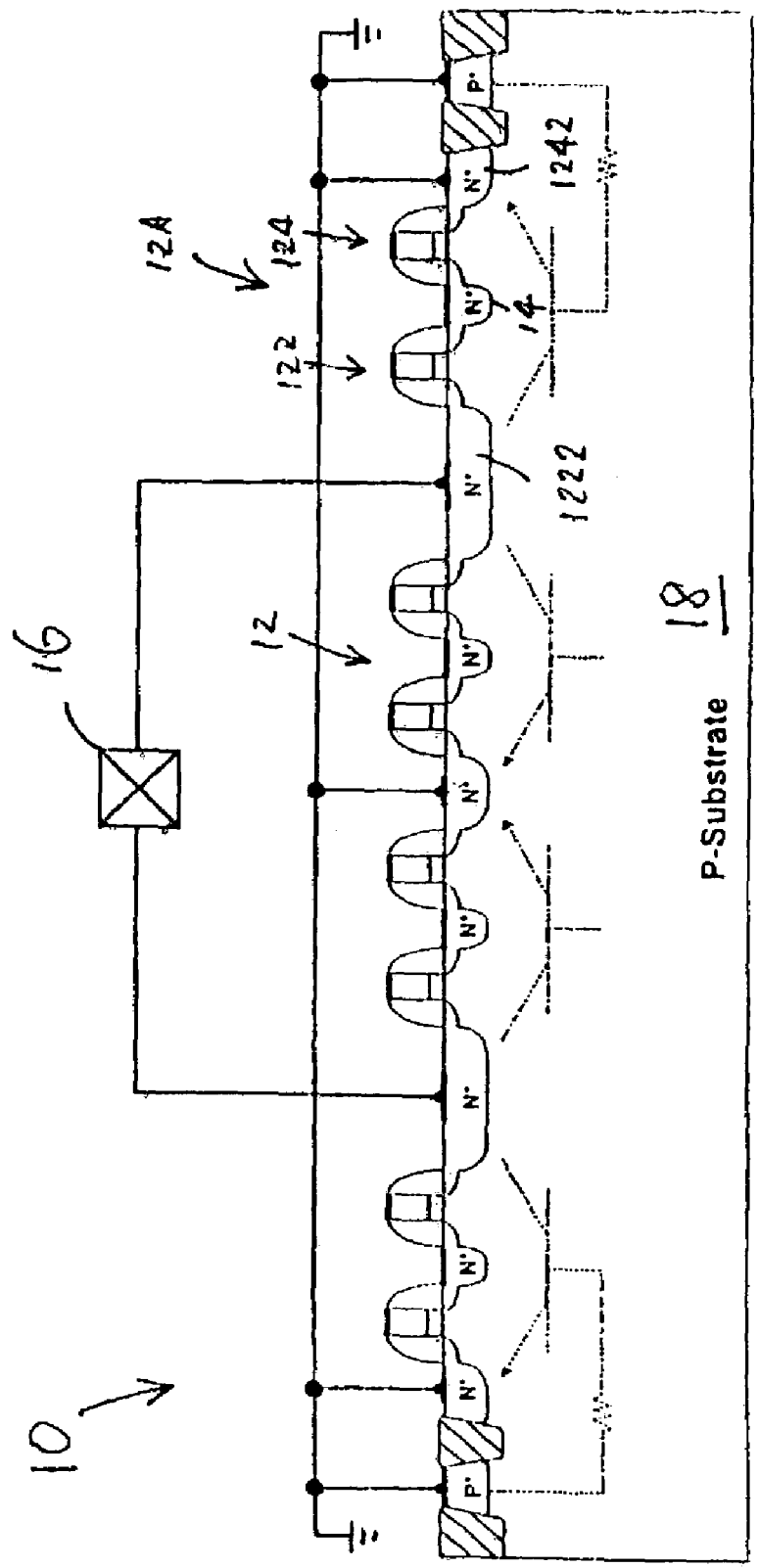

FIGS. 5A and 5B respectively show a layout and a cross-sectional view of a conventional stacked NMOS transistor structure 10. Throughout the context, two or more NMOS transistors connected in a cascode configuration are referred to as a stacked NMOS. Likewise, two or more PMOS transistors connected in a cascode configuration are referred to as a stacked PMOS. Referring to FIG. 5A, the stacked NMOS structure 10 includes a plurality of stacked NMOS devices 12 formed on a p-type substrate 18. A representative stacked NMOS 12A includes a top transistor 122 and a bottom transistor 124 spaced apart by a shared n-type diffusion region 14. The top transistor 122 has a top gate 1220 and a first n-type diffusion region 1222 which serves as a drain for the top transistor 122. The bottom transistor 124 has a bottom gate 1240 and a second n-type diffusion region 1242 which serves as a source for the bottom transistor 124. A plurality of contacts 16 are provided for signal transmission.

Referring to FIG. 5B, the source (not numbered) of the top transistor 122 and the drain (not numbered) of the bottom transistor 124 are merged into the shared diffusion region 14. A parasitic NPN bipolar transistor (shown in dotted line) is established in the substrate 18. The drain 1222 of the top transistor 122, the substrate 18 and the source 1242 of the bottom transistor 124 respectively function as the collector, base and emitter of the parasitic NPN bipolar transistor.

Figure 6A:
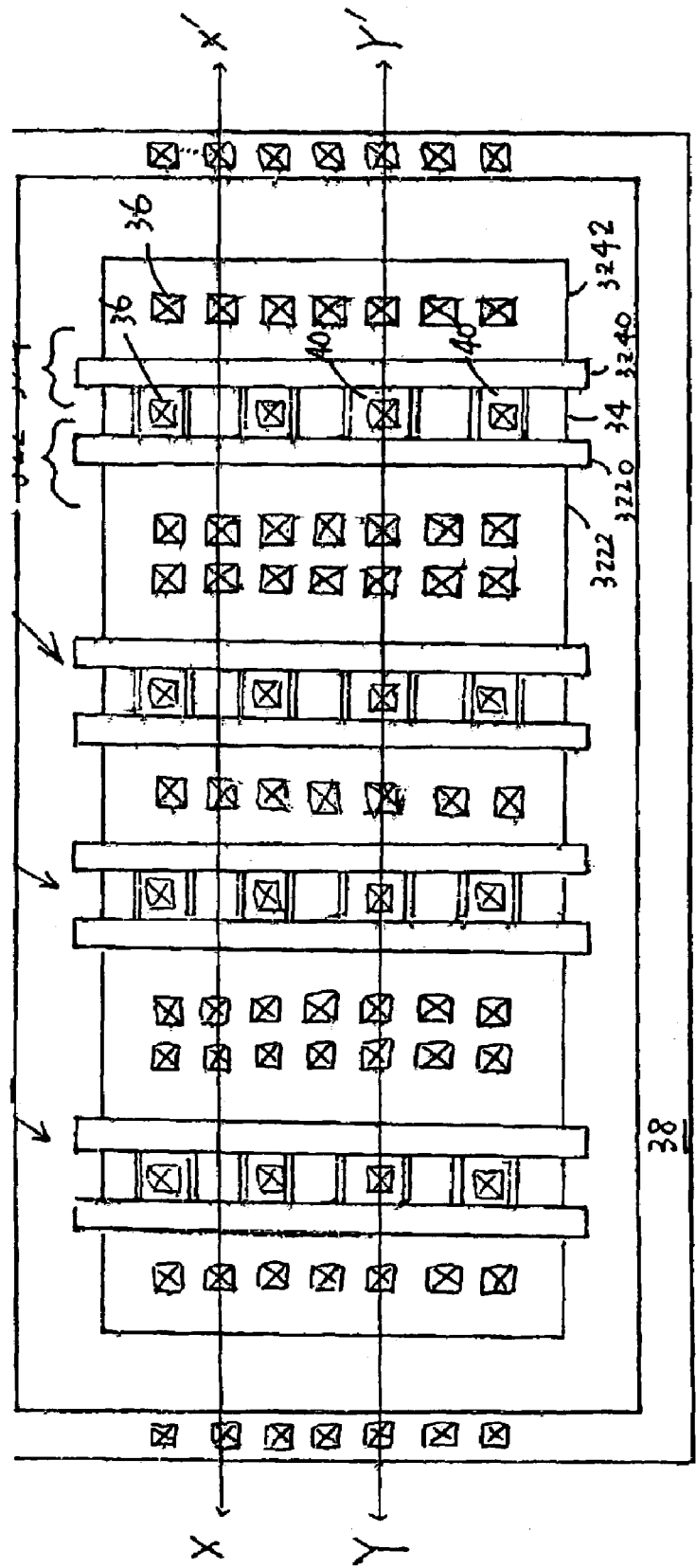
FIGS. 6A and 6B respectively show a layout and a cross-sectional view of an ESD protection device in accordance with one embodiment of the present invention.
Figure 6B:
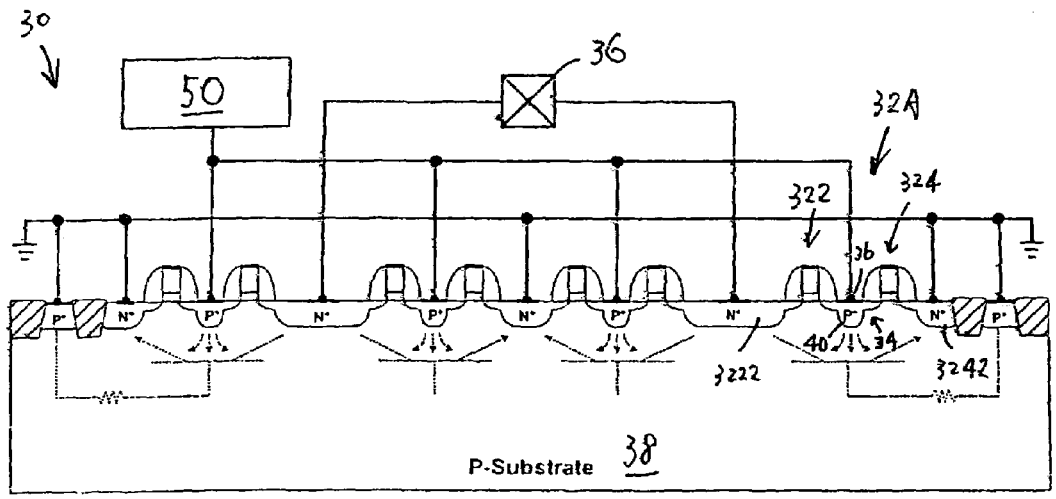

FIGS. 6A and 6B respectively show a layout and a cross-sectional view of an ESD protection device 30 in accordance with one embodiment of the present invention. Referring to FIG. 6A, the ESD protection device 30 is a stacked NMOS device including a plurality of stacked NMOS devices 32 formed on a p-type substrate 38. A representative stacked NMOS 32A includes a top transistor 322 and a bottom transistor 324 spaced apart by a shared n-type diffusion region 34. The top transistor 322 has a top gate 3220 and a first n-type diffusion region 3222 which serves as a drain for the top transistor 322. The bottom transistor 324 has a bottom gate 3240 and a second n-type diffusion region 3242 which serves as a source for the bottom transistor 324. A plurality of contacts 36 are provided for signal transmission.

Figure 6C:
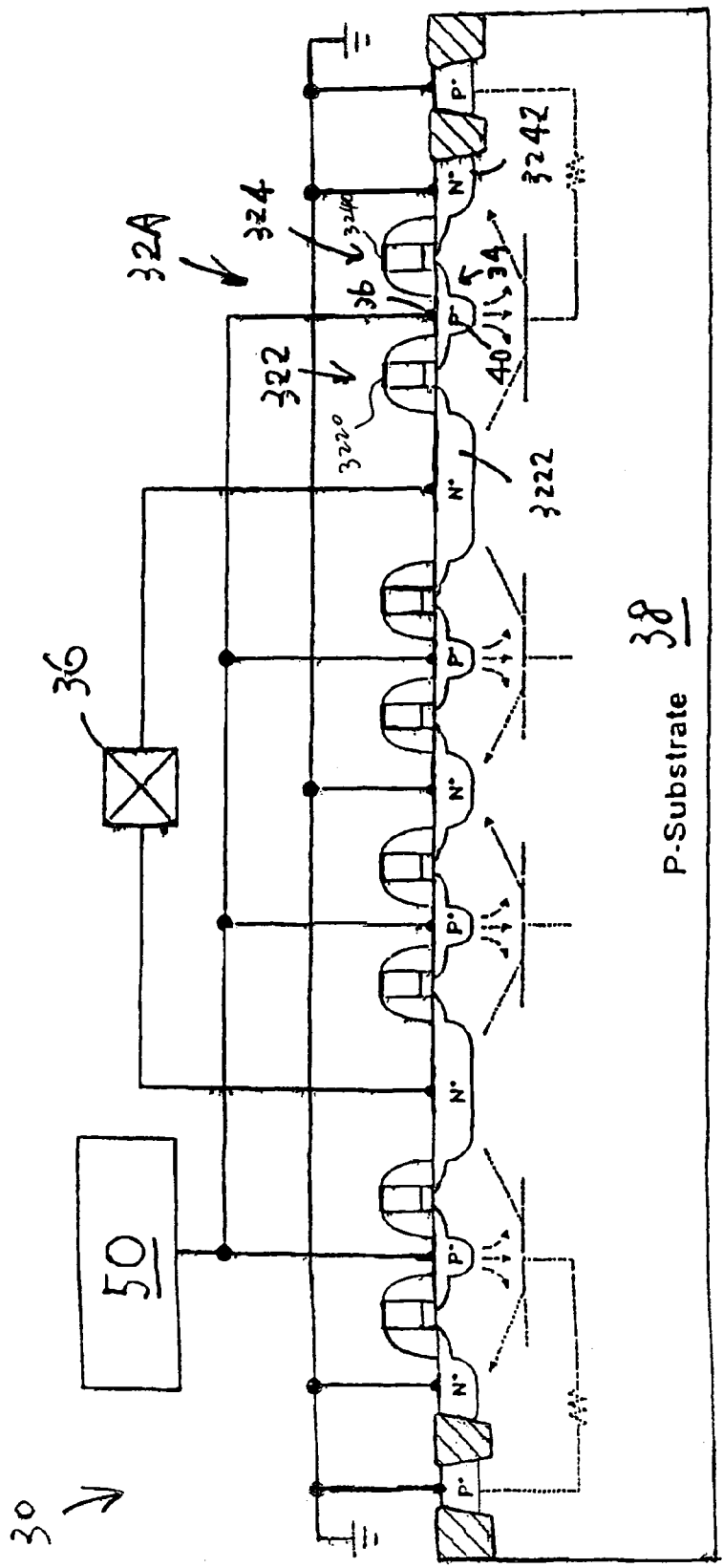
FIG. 6C shows a cross-sectional view of another embodiment of the ESD protection device shown in FIGS. 6A and 6B.

In the shared n-type diffusion region 34, at least a p-type diffusion region 40 is formed to take advantage of the substrate trigger technique. In one embodiment, a plurality of p-type diffusion regions 40 are spaced apart and may be uniformly disposed in the shared region 34. The number and area of the p-type diffusion regions generally depend on the magnitude of a desired substrate trigger current. In one embodiment, the p-type diffusion region 40 overlaps a portion of the top gate 3220 or bottom gate 3240, as shown in FIG. 6C. The cross-sectional view of the device 30 along the X–X' direction is the same as that of the conventional device 30 shown in FIG. 5B, and the cross-sectional view of the device 30 along the Y–Y' direction is shown in FIG. 6B.

Referring to FIG. 6B, the source (not numbered) of the top transistor 322 and the drain (not numbered) of the bottom transistor 324 are merged into the shared diffusion region 34. A parasitic NPN bipolar transistor (shown in dotted line) is established in the substrate 38. The n-type drain 3222 of the top transistor 322, the p-type substrate 38 and the n-type source 3242 of the bottom transistor 324 respectively function as the collector, base and emitter of the parasitic NPN bipolar transistor. The p-type diffusion regions 40 are coupled to an ESD detection circuit 50 through contacts 36 disposed over the p-type diffusion regions 40.

In operation, the detection circuit 50 is inactive during normal operation, and is active during an ESD event. Therefore, during normal operation, the p-type diffusion region 40 is floating or grounded by the detection circuit 50, and does not interfere with internal circuits. During an ESD event, the p-type diffusion region 40 is biased by the detection circuit 50 to generate a substrate current. As long as the voltage drop across the substrate 38 (base) and the source 3242 (emitter) reaches about 0.7V, the parasitic NPN transistor is triggered to bypass an ESD current. The parasitic NPN transistor is triggered on more quicker than that in a conventional stacked NMOS device without p-type regions in a shared n-type diffusion region. The ESD protection device 30 consistent with the present invention thus achieves an improved efficiency on substrate triggering without comprising the layout area.

Figure 7A:
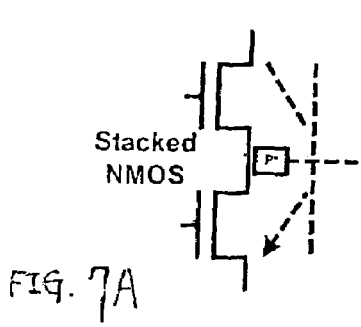
FIGS. 7A and 7B respectively show the circuit symbol for a stacked NMOS and a stacked PMOS in accordance with one embodiment of the present invention.
Figure 7B:
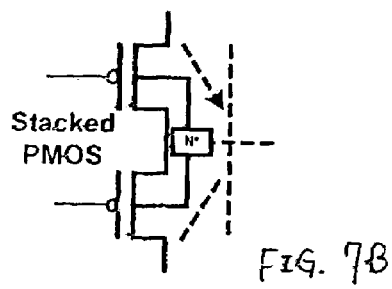

FIGS. 7A and 7B respectively show the circuit symbol for a stacked NMOS and a stacked PMOS in accordance with one embodiment of the present invention. Although the embodiments are described by example of stacked NMOS devices, persons skilled in the art will now understand that the embodiments are also applicable to stacked PMOS devices. A stacked PMOS device consistent with the invention has a similar structure to a stacked NMOS device except that, for example, the dopant types are opposite and the current flows in an opposite direction.

Figure 8A:
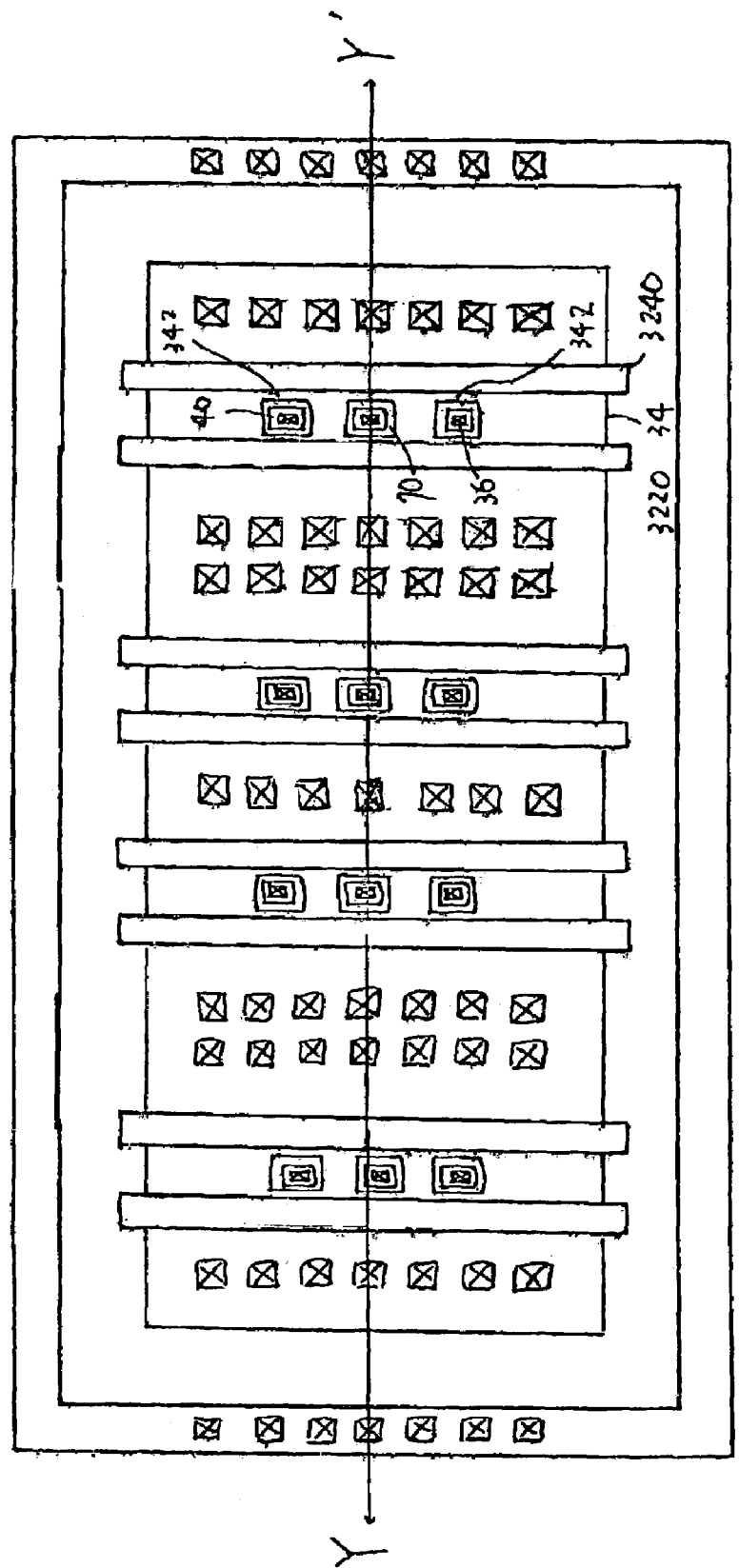
FIGS. 8A and 8B respectively show a layout and a cross-sectional view of an ESD protection device in accordance with another embodiment of the present invention.
Figure 8B:
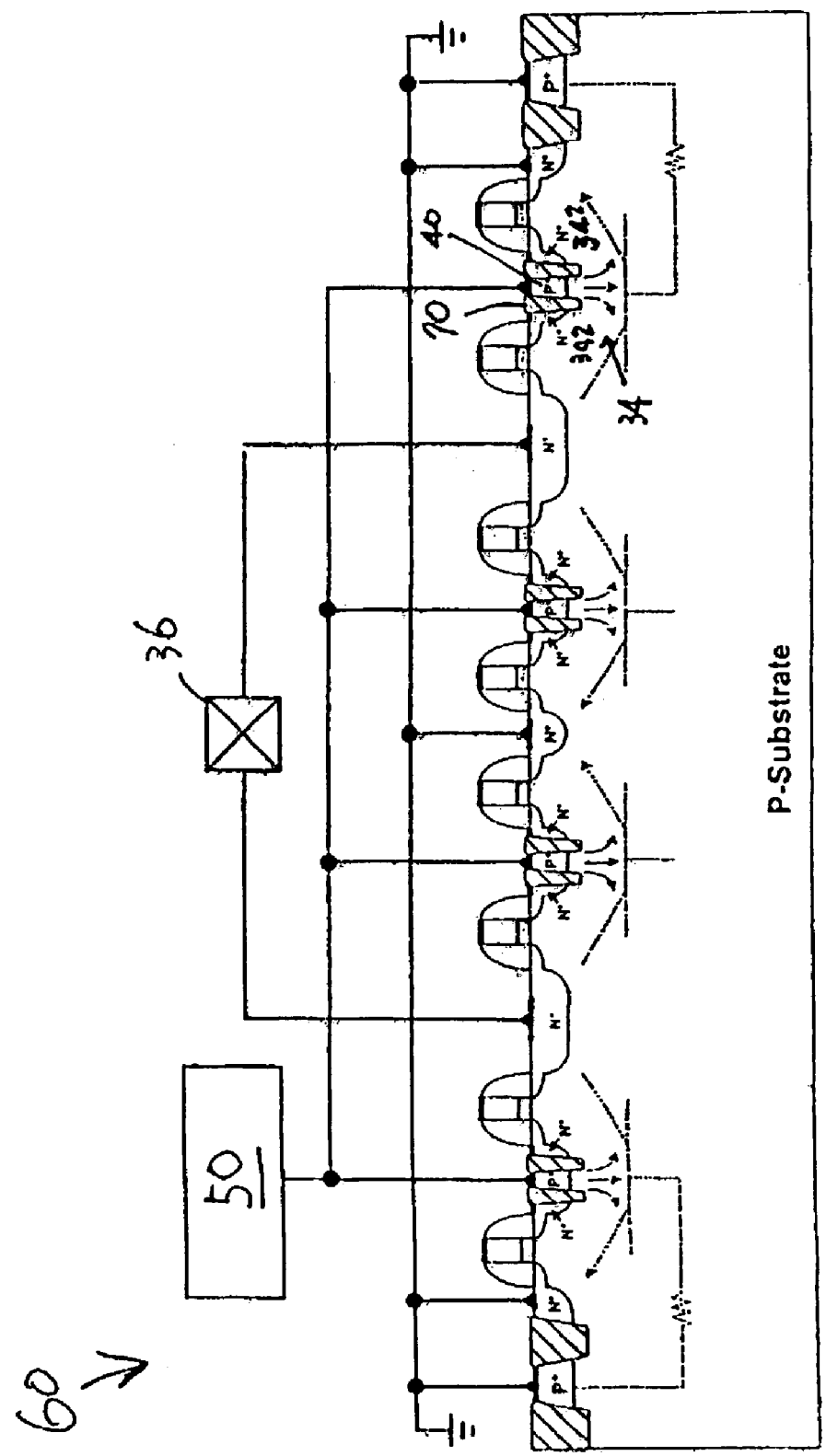

FIGS. 8A and 8B respectively show a layout and a cross-sectional view of an ESD protection device 60 in accordance with one embodiment of the present invention. Referring to FIG. 8A, a plurality of p-type diffusion regions 40 formed in a shared region 34 are contiguous with one another. In one embodiment, the contiguous p-type diffusion regions 40 are spaced apart from the top gate 3220 or a bottom gate 3240 by an n-type diffusion region 342 and a shallow trench isolation (STI) 70. The cross-sectional view of the device 60 on the Y–Y' direction is shown in FIG. 8B. Referring to FIG. 8B, the shallow trench isolation 70 is provided to isolate the n-type diffusion region 342 from the p-type diffusion region 40. The layout area of the ESD protection device 60 is slightly larger than that of the device 30 shown in FIGS. 6A and 6B, but is still smaller than that of conventional designs.

Figure 9:
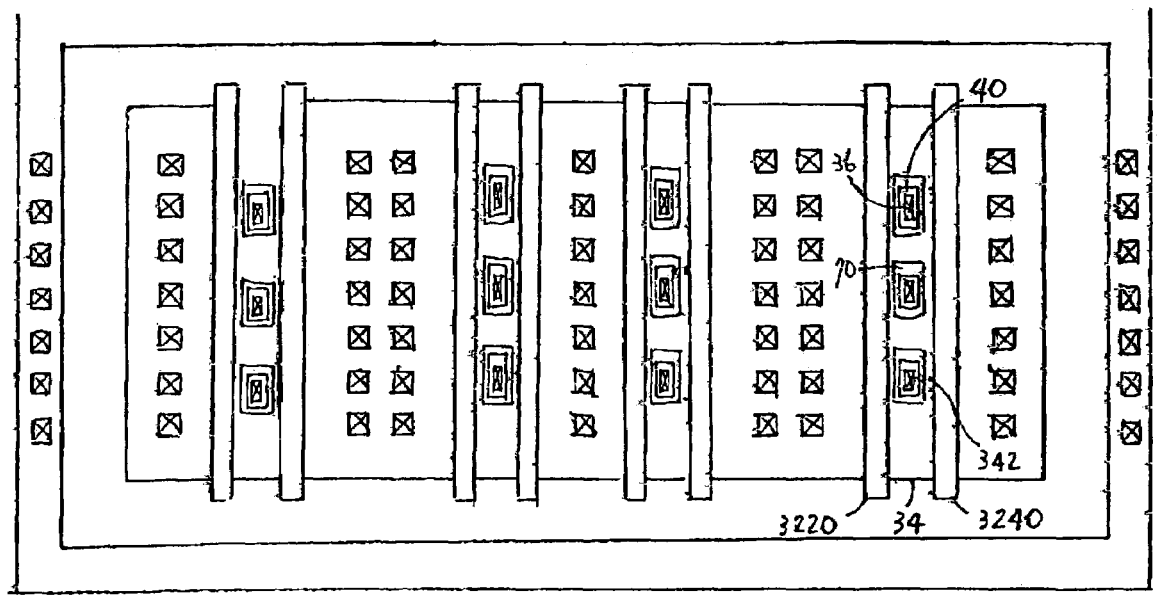
FIG. 9 shows a layout of an ESD protection device in accordance with yet another embodiment of the present invention.

FIG. 9 shows a layout of an ESD protection device 80 in accordance with one embodiment of the present invention. Referring to FIG. 9, a plurality of p-type diffusion regions 40 formed in a shared region 34 are spaced apart from one another. Each p-type diffusion region 40 is spaced apart from the top gate 3220 or the bottom gate 3240 by the n-type diffusion region 342 and the shallow trench isolation 70.

Figure 1:
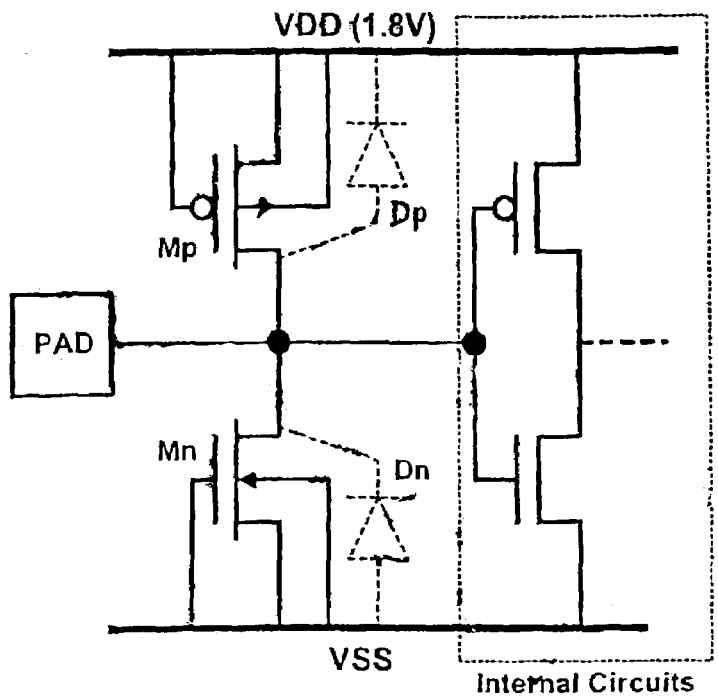
FIG. 1 shows a circuit diagram of a conventional ESD protection device.
Figure 2:
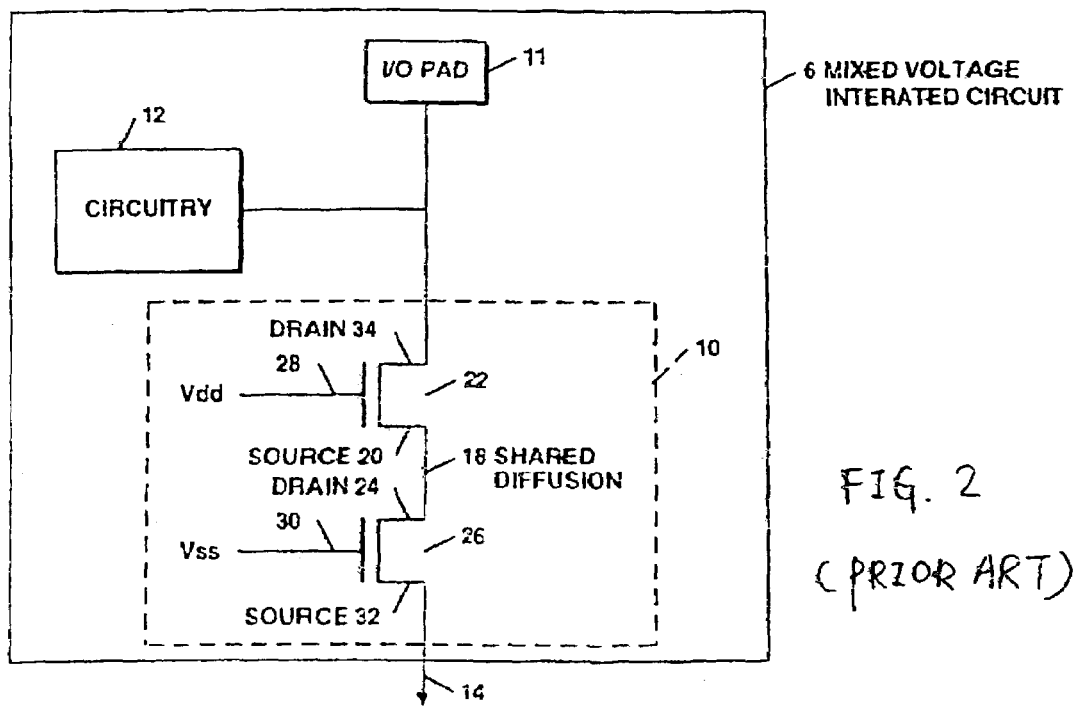
FIG. 2 shows a circuit diagram of another conventional ESD protection device.
Figure 3:
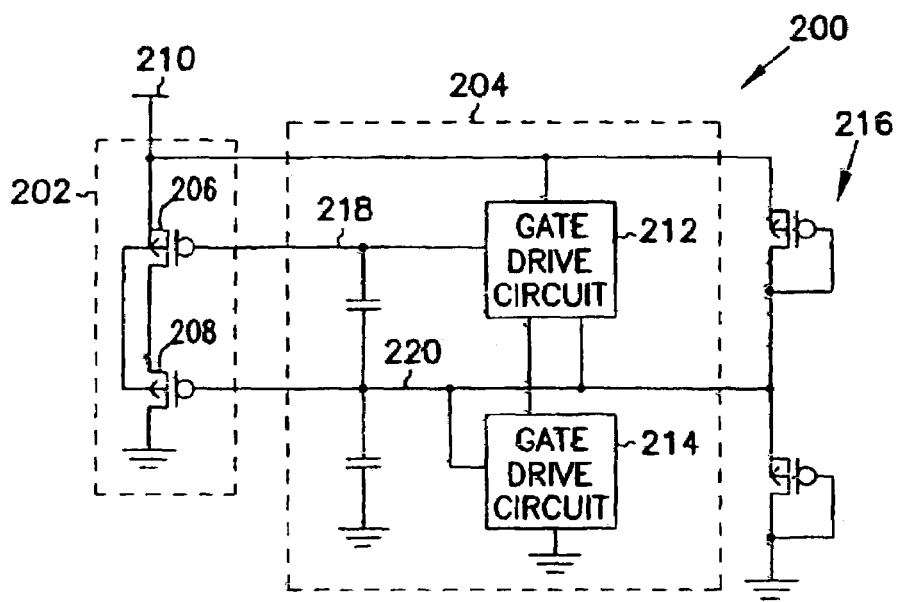
FIG. 3 shows a circuit diagram of still another conventional ESD protection device.
Figure 4:
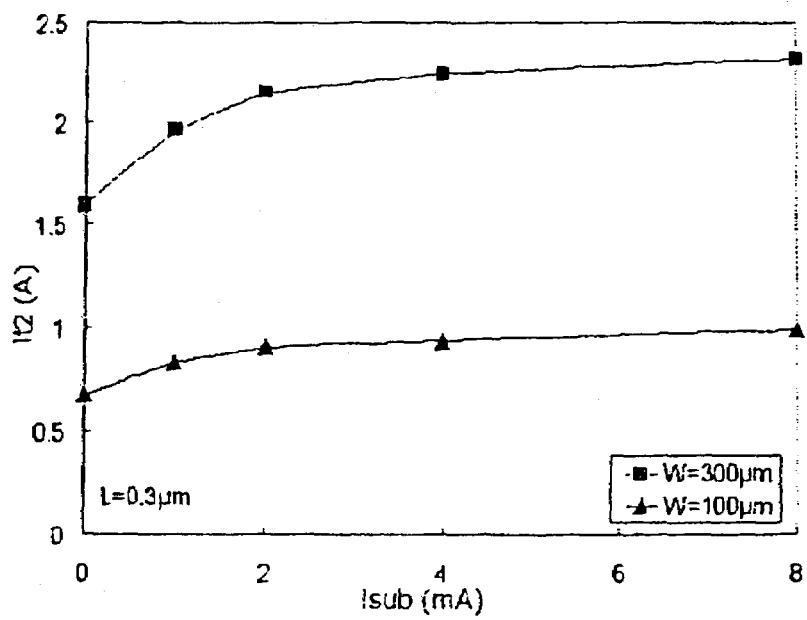
FIG. 4 shows an $It_2$ versus $I_{sub}$ curve.
Figure 10A:
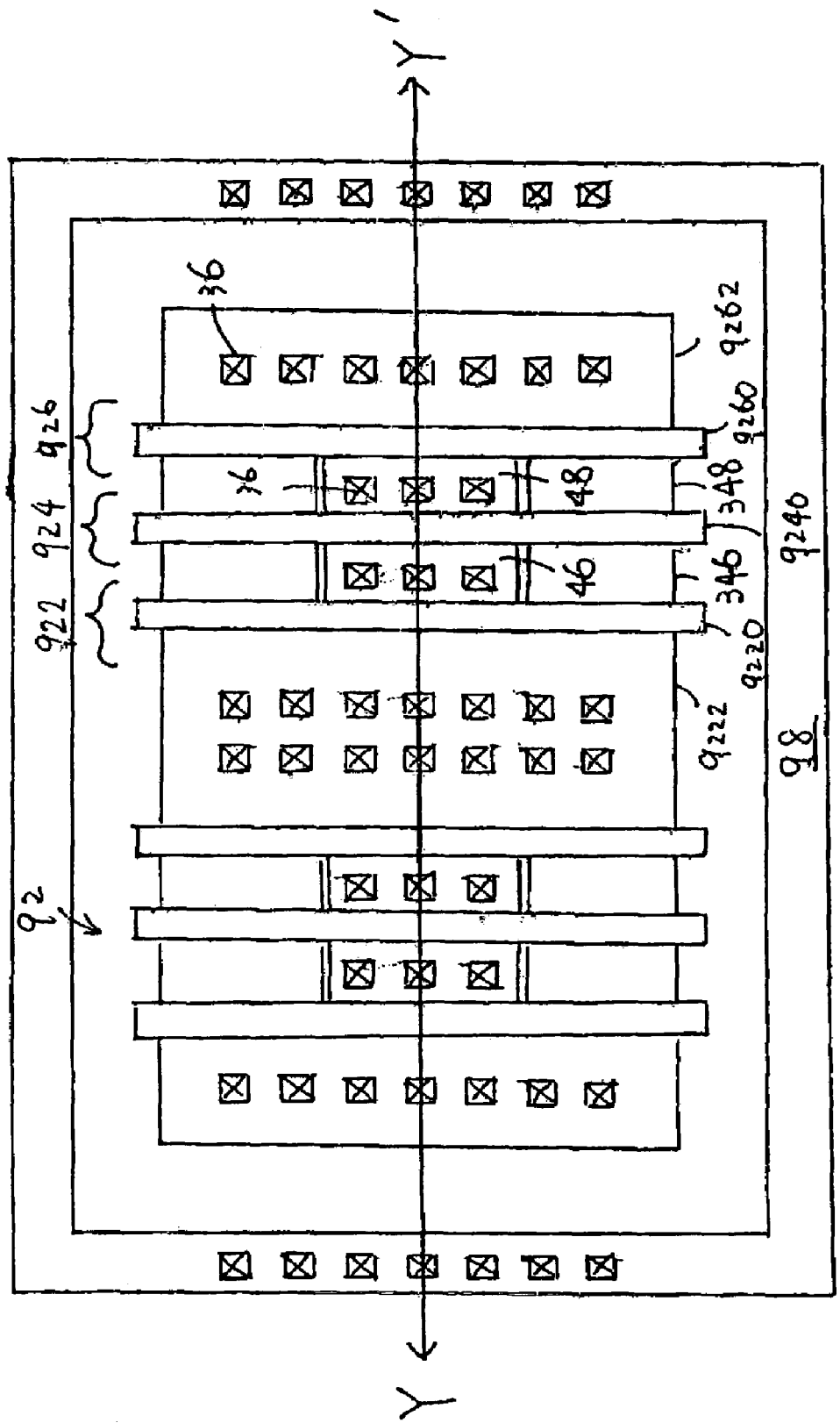
FIGS. 10A and 10B respectively show a layout and a cross-sectional view of an ESD protection device in accordance with still another embodiment of the present invention.
Figure 10B:
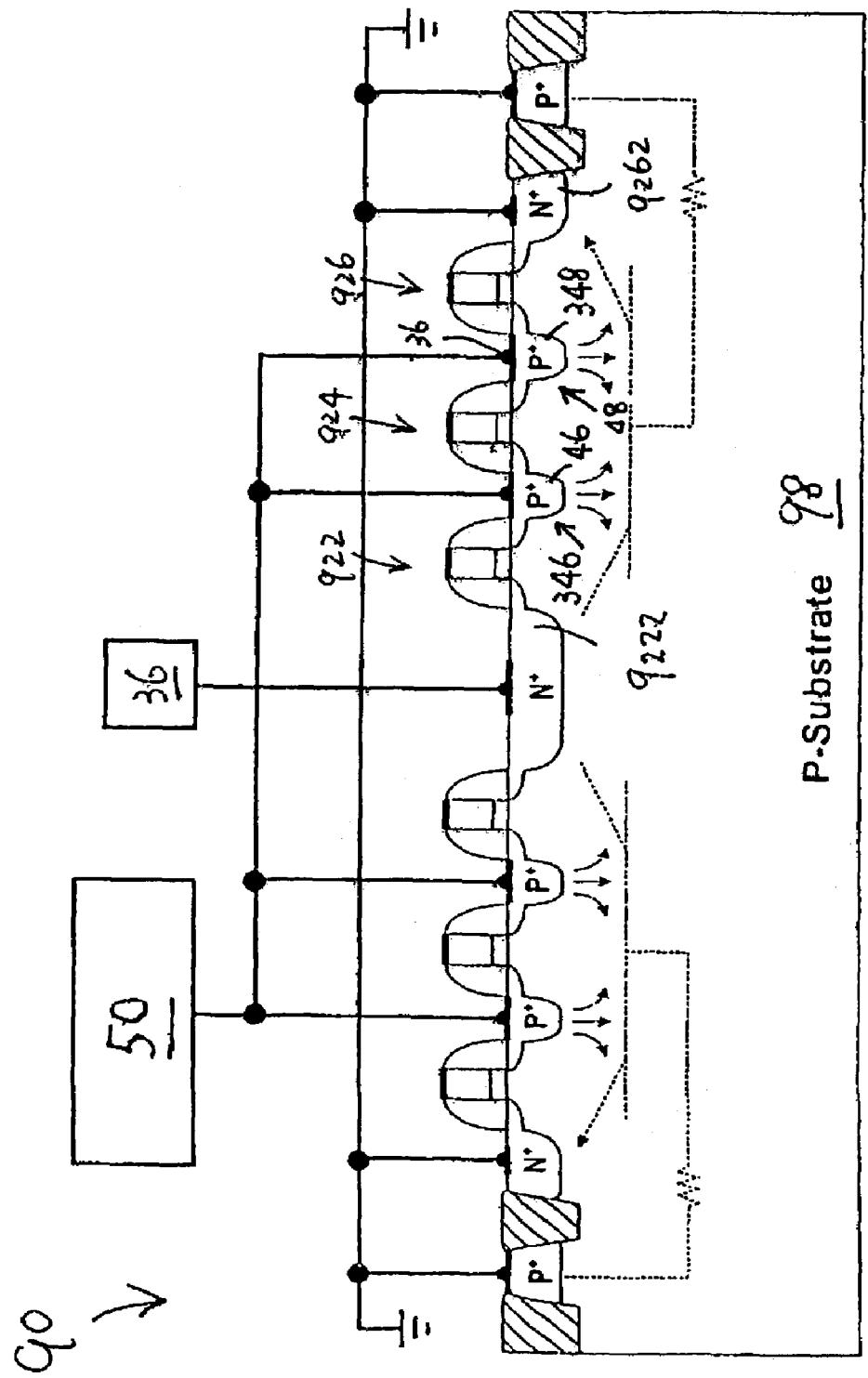

FIGS. 10A and 10B respectively show a layout and a cross-sectional view of an ESD protection device 90 in accordance with one embodiment of the present invention. Referring to FIG. 1A, the ESD protection device 90 is a stacked NMOS including a plurality of stacked NMOS devices 92 formed on a p-type substrate 98. A representative stacked NMOS device 92A includes a top transistor 922, a central transistor 924 and a bottom transistor 926 spaced apart by a first shared n-type diffusion region 346 and a second shared n-type diffusion region 348. The top transistor 922 has a top gate 9220 and a first n-type diffusion region 9222 which serves as a drain for the top transistor 922. The central transistor 924 has a central gate 9240. The bottom transistor 926 has a bottom gate 9260 and a second n-type diffusion region 9262 which serves as a source for the bottom transistor 926. A plurality of contacts 36 are provided for signal transmission.

In the shared n-type diffusion region 346 or 348, at least a p-type diffusion region 46 or 48 is formed to take advantage of the substrate trigger technique. In one embodiment, a plurality of p-type diffusion regions 46 are contiguous with one another in the shared diffusion region 346. In another embodiment, the p-type diffusion regions 46 are spaced apart and may be uniformly disposed in the shared region 346. In still another embodiment, the p-type diffusion regions 46 are spaced apart from the top gate 9220 or the central gate 9240 by an n-type diffusion region (not shown). In yet another embodiment, the p-type diffusion regions 46 overlap a portion of the top gate 9220 or the central gate 9240. The cross-sectional view of the device 90 along the Y–Y' direction is shown in FIG. 10B.

Referring to FIG. 10B, the source (not numbered) of the top transistor 922 and the drain (not numbered) of the central transistor 924 are merged into the shared diffusion region 346, and the source (not numbered) of the central transistor 924 and the drain (not numbered) of the bottom transistor 926 are merged into the shared diffusion region 348. A parasitic NPN bipolar transistor (shown in dotted line) is established in the substrate 98. The n-type drain 9222 of the top transistor 922, the p-type substrate 98 and the n-type source 9262 of the bottom transistor 926 respectively function as the collector, base and emitter of the parasitic NPN bipolar transistor. The p-type diffusion regions 46 and 48 are coupled to an ESD detection circuit 50 through contacts 36 disposed over the regions 46 and 48. The operation of the ESD protection device 90 is similar to that of the device 30 shown in FIGS. 6A and 6B, and therefore is not explained in detail.

The substrate-triggered stacked NMOS and the well-triggered stacked PMOS devices consistent with the invention as described in the above embodiments are implemented as an I/O protection circuit or a VDD to VSS clamp circuit for a mixed voltage interface, as will be explained in more detail below.

Figure 11:
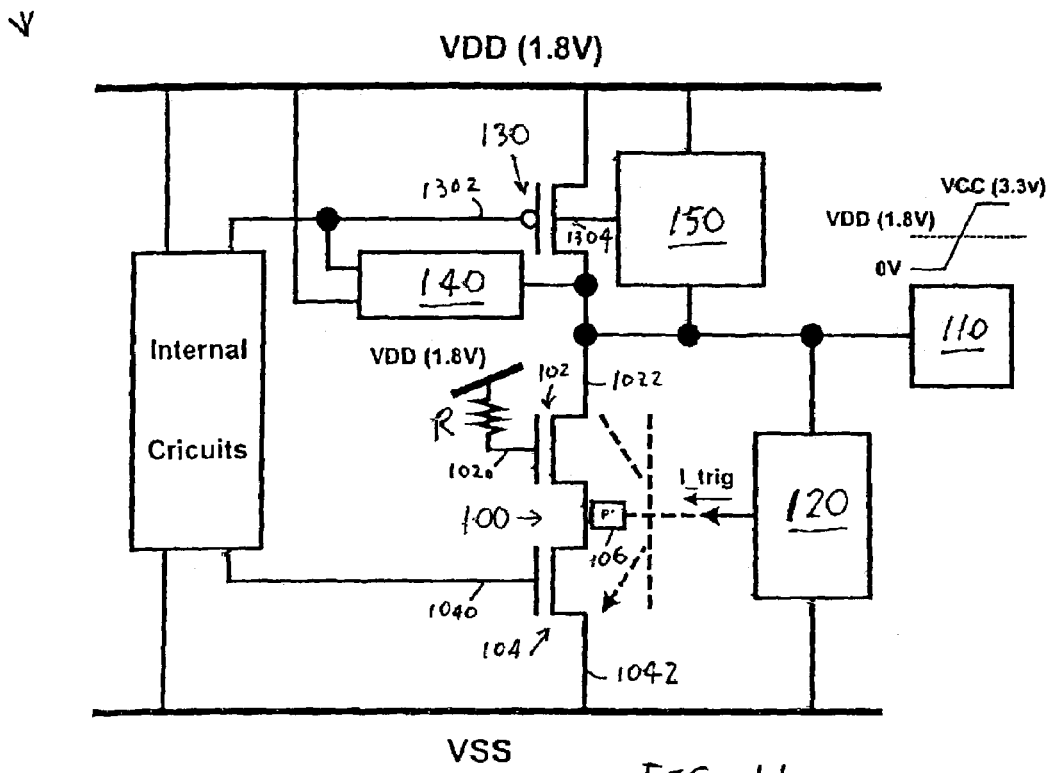
FIG. 11 is a circuit diagram for output-stage ESD protection in accordance with one embodiment of the present invention.

FIG. 11 is a circuit diagram for output-stage ESD protection in accordance with one embodiment of the present invention. Referring to FIG. 11, a substrate-triggered stacked NMOS 100 in an ESD protection circuit 200 includes a top NMOS transistor 102, and a bottom NMOS transistor 104 connected in a cascode configuration. The top transistor 102 and the bottom transistor 104 share an n-type diffusion region (not shown) in which a p-type diffusion region 106 is formed. The top transistor 102 has a drain terminal 1022 coupled to an output pad 110 and a gate 1020 coupled through a resistor R to a high voltage line, VDD. In one embodiment, the resistor R is realized by a diffusion resistance in the stacked NMOS 100. The bottom transistor 104 has a source terminal 1042 coupled to a low voltage line, VSS, and a gate 1040 coupled to the internal circuits to be protected from an ESD event. The output pad 110 is coupled to the p-type diffusion region 106 through an ESD detection circuit 120. The detection circuit 120 does not become active until an ESD event occurs.

During an ESD event, the detection circuit 120 provides a current I_trig to the substrate-triggered p-type diffusion region 106, resulting in a voltage drop across the base and emitter of a parasitic bipolar transistor (shown in dotted line). As long as the voltage drop of the p-n junction reaches a certain value, for example, 0.7V, the parasitic transistor is switched on to discharge an ESD current. When the I/O signal at the pad 110 rises from 0V to 3.3V, the bottom gate 1040 is biased at 0V by the internal circuits and the stacked NMOS 100 is turned off. At this point, the voltage across the shared n-type diffusion region is approximately VDD minus Vth (threshold voltage). That is, the voltage drop of the gate oxides of the stacked NMOS 100 is less than 1.8V, which permits the stacked NMOS 100 to be fabricated by thin gate oxide processes.

The circuit 200 may include a pull-up PMOS 130 coupled between VDD and the pad 110. The PMOS 130 has a gate 1302 coupled to a gate tracking circuit 140, and a body terminal 1304 coupled to an N-well self biased circuit 150. The tracking circuit 140 tracks the gate voltage of the PMOS 130 and the self-biased circuit 150 tracks the N-well voltage of the PMOS to ensure that the pull-up PMOS 130 does not conduct current when a 3.3V signal is present at the pad 110. The tracking circuit 140 is inactive and keeps the gate 1302 of the PMOS 130 at 1.8V when the output voltage is below VDD (1.8V), and allows the voltage of the gate 1302 to rise with the output voltage when the output voltage is over VDD. The N-well self-biased circuit 150 is inactive and keeps the N-well 1304 of the PMOS 130 at 1.8V when the output voltage is below VDD (1.8V), and allows the voltage of the N-well 1304 to rise with the output voltage when the output voltage is over VDD.

Figure 12:
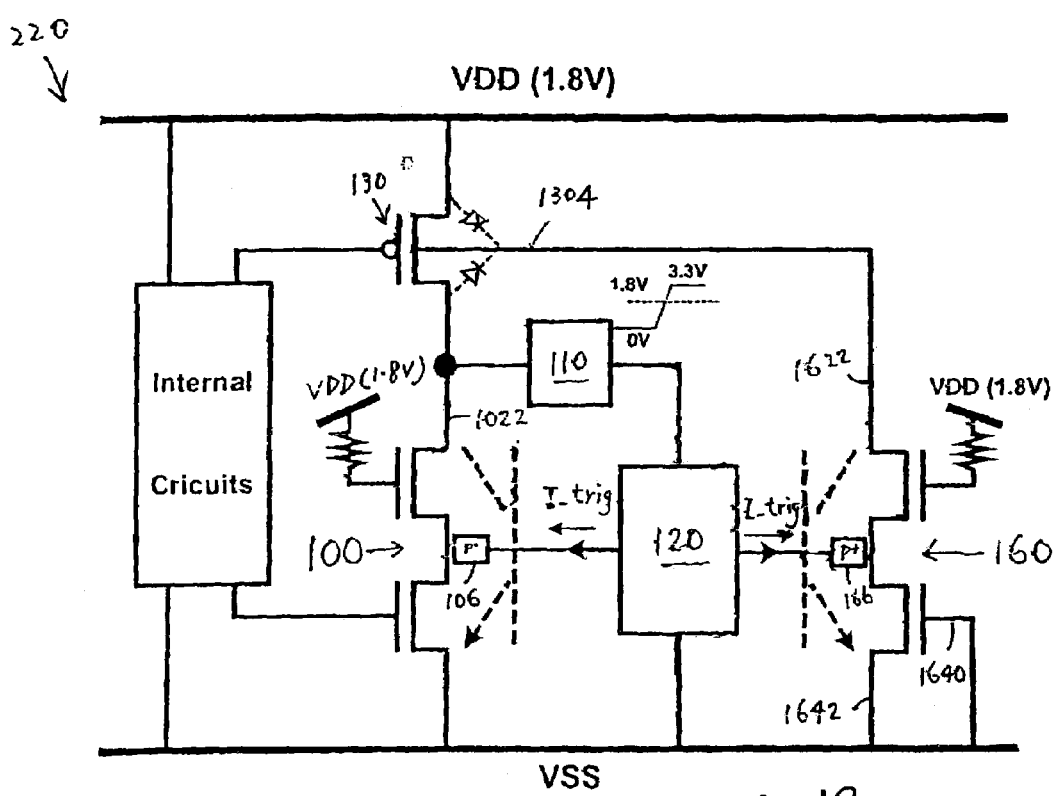
FIG. 12 is a circuit diagram for output-stage ESD protection in accordance with another embodiment of the present invention.

FIG. 12 is a circuit diagram for output-stage ESD protection in accordance with another embodiment of the present invention. Referring to FIG. 12, an ESD protection circuit 220 meets the requirement of low parasitic capacitance for high speed applications. Generally, to meet ESD specifications, an ESD protection device often has a larger area than internal circuits. As a result, the parasitic capacitance resulting from the ESD protection device is larger than that from the internal circuits. It is thus required to reduce the parasitic capacitance resulting from an ESD protection device to meet the specification of high speed integrated circuits.

Referring to FIG. 12, the circuit 220 includes the NMOS 100 as a first stacked NMOS which serves as an output buffer and a second stacked NMOS 160 which serves as an ESD protection device. The substrate-triggered stacked NMOS 100 is designed to meet the specification of internal circuits. The substrate-triggered stacked NMOS 160 has a drain 1622 coupled to the body, or N-well 1304 of a pull-up PMOS 130, and a bottom gate 1640 coupled to the VSS so that the stacked NMOS 160 is off during normal operation. The output stage of the circuit 220 may minimize the parasitic capacitance because an output pad 110 is coupled to the stacked NMOS 160 through a forward-biased parasitic diode (shown in dotted line) in the P+/N-well of the PMOS 130. Although the voltage across the forward-biased parasitic diode is about 0.7V, the voltage drop does not affect the turn-on behavior of the stacked NMOS device 160 and may be neglected during an ESD event.

During an ESD event, an ESD detection circuit 120 becomes active and provides a trigger current I_trig to trigger the p-type diffusion regions 106 and 166, respectively, of the first stacked NMOS 100 and the second stacked NMOS 160 so as to raise the substrate potential and turn on the stacked NMOS 100 and 160 to conduct an ESD current. Therefore, the circuit 220 provides two discharge paths: one from the output pad 110 through the stacked NMOS 100 to VSS, and the other from the pad 110, through the P+/N-well diode and the stacked NMOS 160 to VSS.

During normal operation, the ESD detection circuit 120 becomes inactive and provides no current to the p-type diffusion regions 106 and 166. A gate tracking circuit (not shown) and an N-well self-biased circuit (not shown) may be coupled to the pull-up PMOS 130 and provide the functions described above with respect to the circuit 200.

Figure 13:
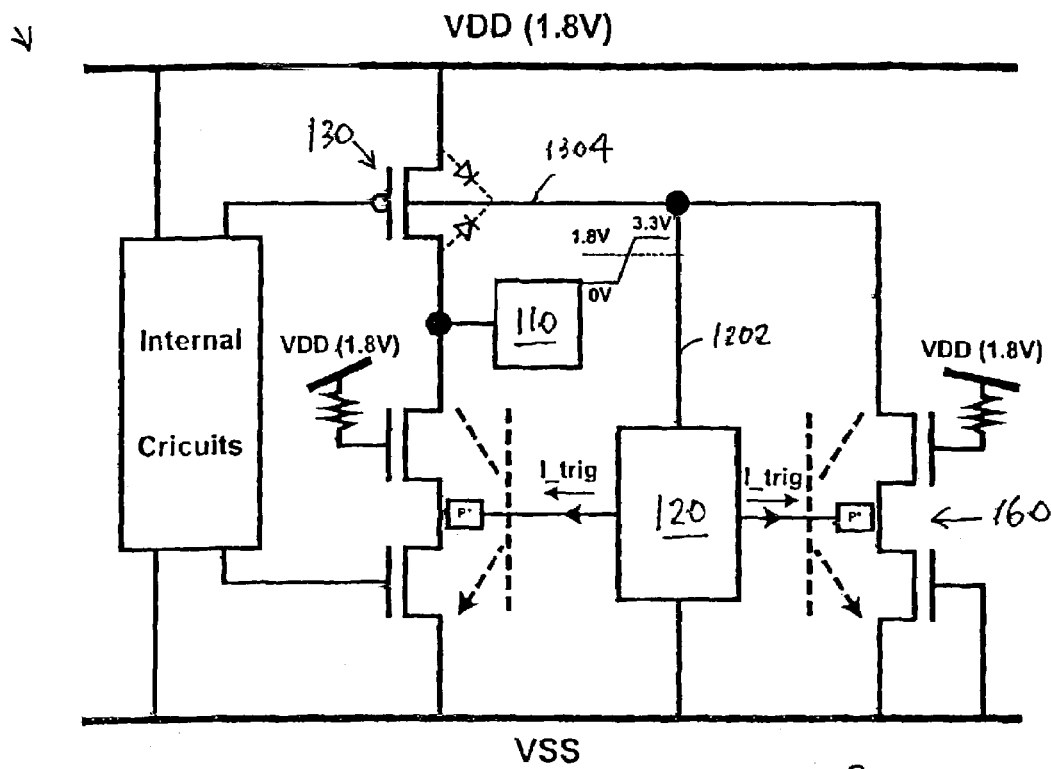
FIG. 13 is a circuit diagram for output-stage ESD protection in accordance with yet another embodiment of the present invention.

FIG. 13 is a circuit diagram for output-stage ESD protection in accordance with yet another embodiment of the present invention. Referring to FIG. 13, an ESD protection circuit 240 has the same structure as the circuit 220 shown in FIG. 12 except that an anode 1202 of the ESD detection circuit 120 is coupled to the N-well 1304 of the PMOS 130 instead of the pad 110. The circuit 240 may minimize the parasitic capacitance resulting from the ESD protection device 160 and the detection circuit 120, and reduce the likelihood of malfunction of the ESD protection device 160 resulting from noise signals. The circuit 240 thus may have a high signal noise margin.

Figure 14:
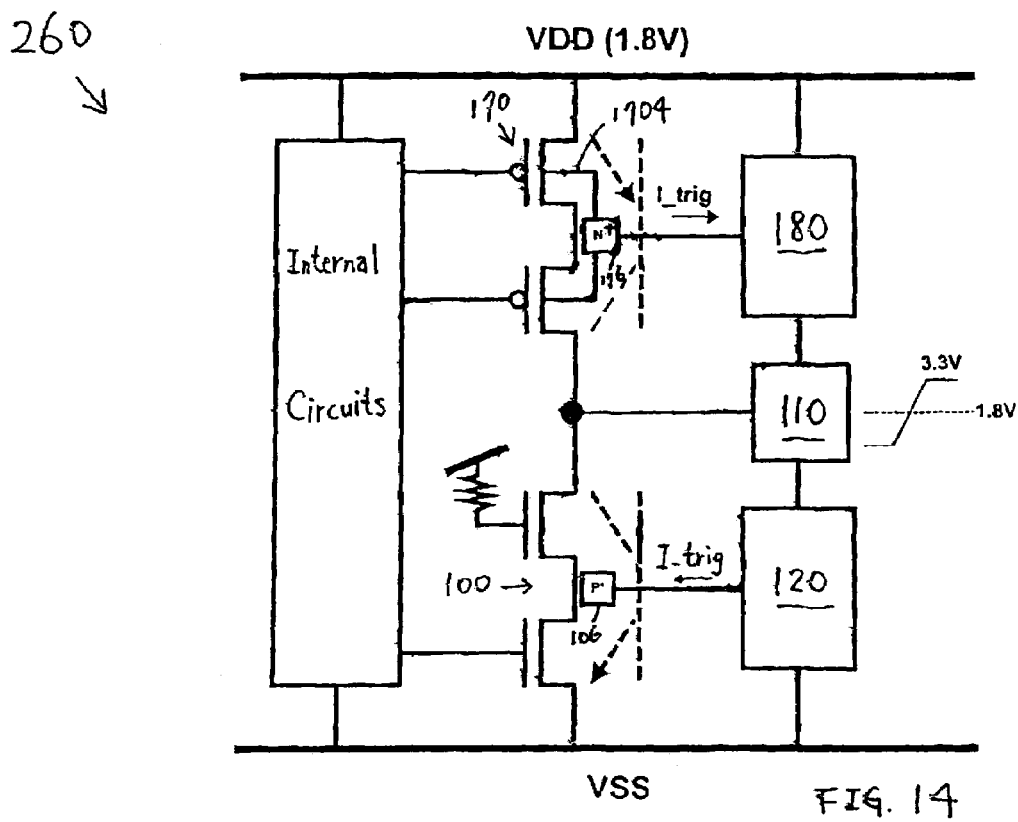
FIG. 14 is a circuit diagram for output-stage ESD protection in accordance with still another embodiment of the present invention.

FIG. 14 is a circuit diagram for output-stage ESD protection in accordance with still another embodiment of the present invention. Referring to FIG. 14, an ESD protection circuit 260 includes a well-triggered stacked PMOS 170 and the NMOS 100 as a substrate-triggered stacked NMOS. The stacked NMOS 100 and the stacked PMOS 170 respectively have a p-type diffusion region 106 and an n-type diffusion region 176 coupled to the ESD detection circuit 120 and a second ESD detection circuit 180, respectively. The well-triggered stacked PMOS 170 is used as an ESD protection device between VDD and a pad 110. During an ESD event, a portion of an initial ESD current is conducted from VDD through the N-well 1704 and the second ESD detection circuit 180 to the output pad 110 without any junction breakdown. The transistors (not numbered) of the stacked NMOS 100 and the stacked PMOS are all fabricated as thin-gate oxide devices (1.8V) to sustain a high voltage signal (3.3V). As a result, a thick-gate oxide mask is eliminated and the process is more cost efficient.

Figure 15:
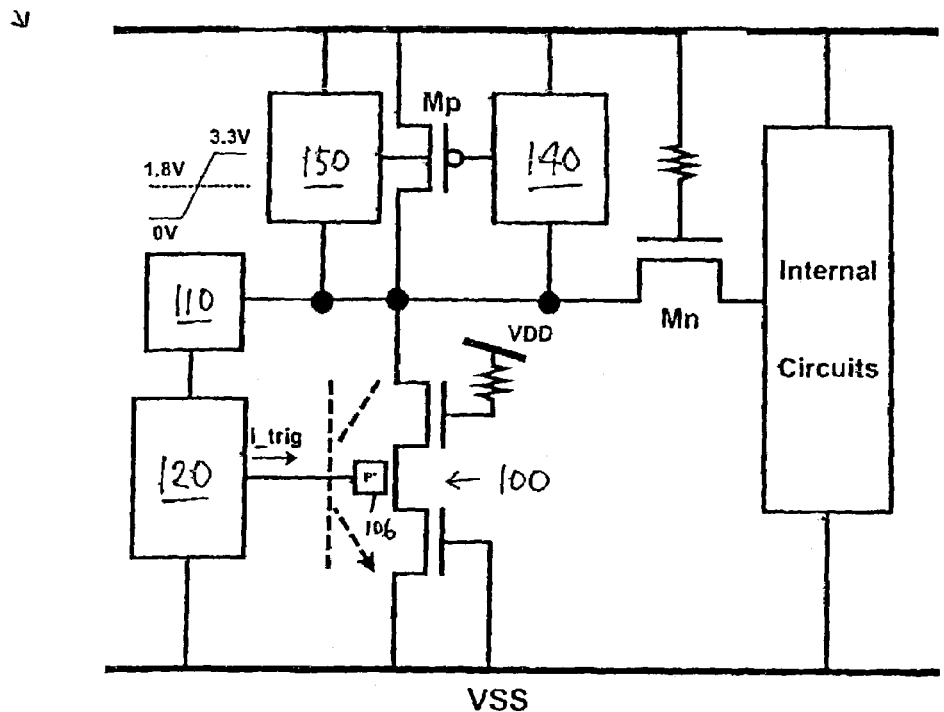
FIG. 15 is a circuit diagram for input-stage ESD protection in accordance with one embodiment of the present invention.

FIG. 15 is a circuit diagram for input-stage ESD protection in accordance with one embodiment of the present invention. Referring to FIG. 15, an ESD protection circuit 280 includes the stacked NMOS 100 for pad-to-VSS ESD protection, and a PMOS transistor Mp for pad-to-VDD ESD protection. An NMOS transistor Mn serves as a level shifter to avoid gate oxide overstress of internal circuits when an input voltage is, for example, 3.3V. The gate tracking circuit 140 is coupled to Mp for tracking the gate voltage of Mp. An N-well self-biased circuit 150 is coupled to Mp for tracking the N-well voltage of Mp. The gate tracking circuit 140 and the N-well self-biased circuit 150 are provided to ensure that Mp does not conduct current when a 3.3V signal is applied to an input pad 110.

During normal operation, the stacked NMOS 100 and Mp are inactive and therefore do not interfere with the functions of the internal circuits. During an ESD event, an ESD detection circuit 120 provides a trigger current I_trig to the p-type diffusion 106 of the stacked NMOS 100, resulting in a voltage drop across the substrate (base) and source (emitter) junction of a parasitic NPN bipolar transistor (shown in dotted line). As long as the voltage drop across the p-n junction reaches, for example, 0.7V, the parasitic transistor is switched on and triggers the stacked NMOS 100 to discharge an ESD current.

Figure 16:
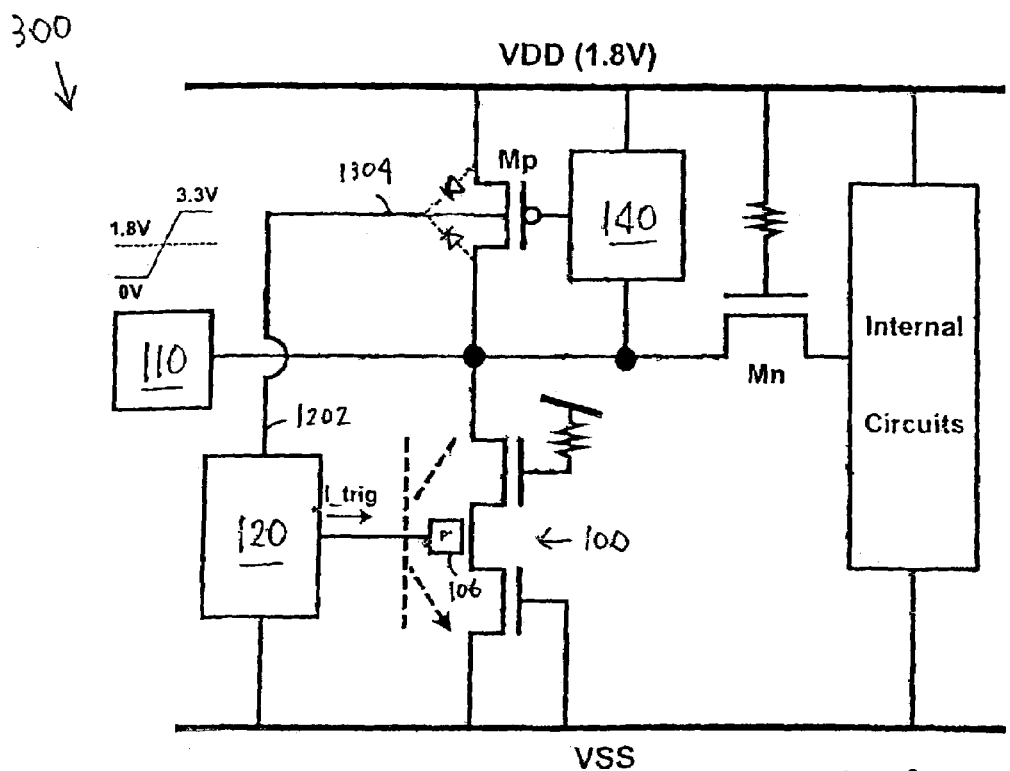
FIG. 16 is a circuit diagram for input-stage ESD protection in accordance with another embodiment of the present invention.

FIG. 16 is a circuit diagram for input-stage ESD protection in accordance with another embodiment of the present invention. Referring to FIG. 16, an ESD protection circuit 300 has the same structure as the circuit 280 shown in FIG. 15 except that the anode 1202 of the ESD detection circuit 120 is coupled to an N-well 1304 of Mp instead of the pad 110. The circuit 300 may have a high noise margin and a minimized parasitic capacitance due to the forward-biased diode p-n junction (shown in dotted line) in Mp.

During normal operation, Mp and the stacked NMOS 100 are inactive. During an ESD event, the ESD detection circuit 120 conducts an initial ESD current from the pad 110 through the P+/N-well junction in Mp and through the ESD detection circuit 120 to the p-type diffusion region 106 of the stacked NMOS 100. As long as the voltage drop across the substrate (base) and source (emitter) junction of a parasitic NPN bipolar transistor (shown in dotted line) reaches, for example, 0.7V, the parasitic transistor is switched on and triggers the stacked NMOS 100 to discharge an ESD current.

Figure 17:
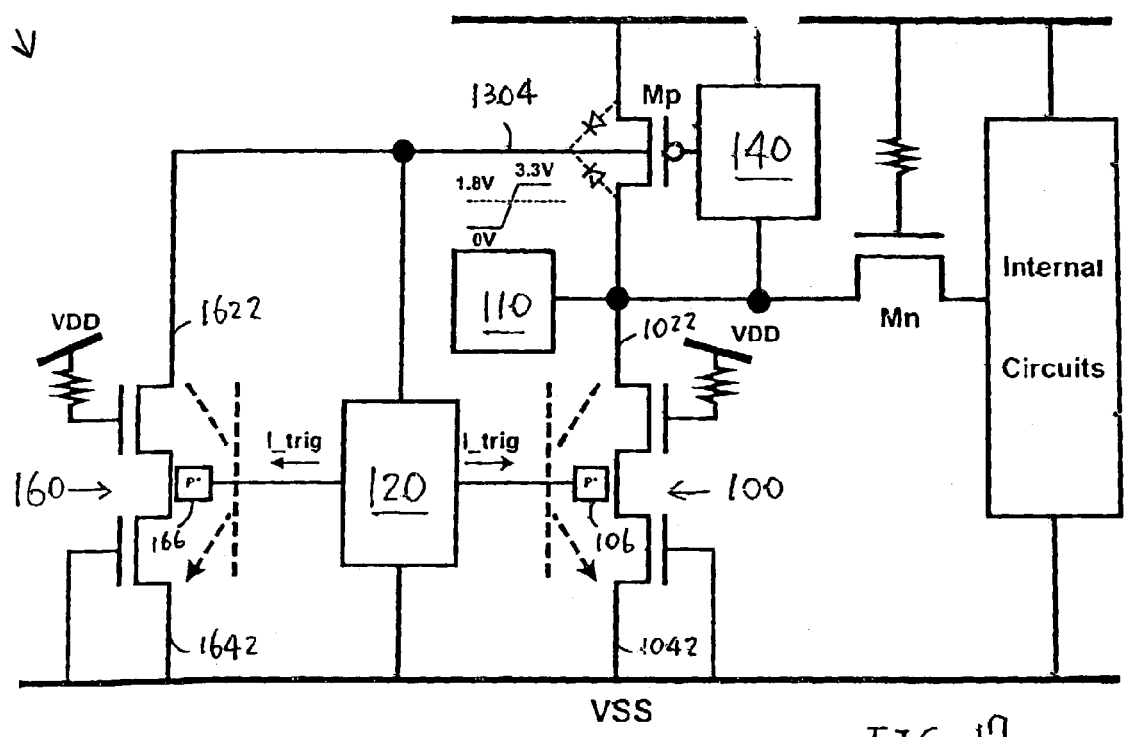
FIG. 17 is a circuit diagram for input-stage ESD protection in accordance with yet another embodiment of the present invention.

FIG. 17 is a circuit diagram for input-stage ESD protection in accordance with yet another embodiment of the present invention. Referring to FIG. 17, an ESD protection circuit 320 includes the stacked NMOS 100 as a first stacked NMOS and a second stacked NMOS 160 having a larger area than the first stacked NMOS 100. The first stacked NMOS 100 has an anode 1022 coupled to the input pad 110 and a cathode 1042 coupled to VSS. The second stacked NMOS 160 has an anode 1622 coupled to the body or N-well 1304 of a PMOS Mp, and a cathode 1642 coupled to VSS. The circuit 320 may minimize the parasitic capacitance of the second stacked NMOS 160 due to the forward-biased diode P+/N-well junction (shown in dotted line) in Mp.

During an ESD event, the ESD detection circuit 120 becomes active and conducts an initial ESD current from the pad 110 through the P+/N-well junction to the p-type diffusion regions 106 and 166 respectively of the stacked NMOS 100 and 160. As long as the parasitic transistors (shown in dotted line) in the stacked NMOS 100 and 160 are switched on, the ESD current is bypassed through the parasitic transistors.

Figure 18:
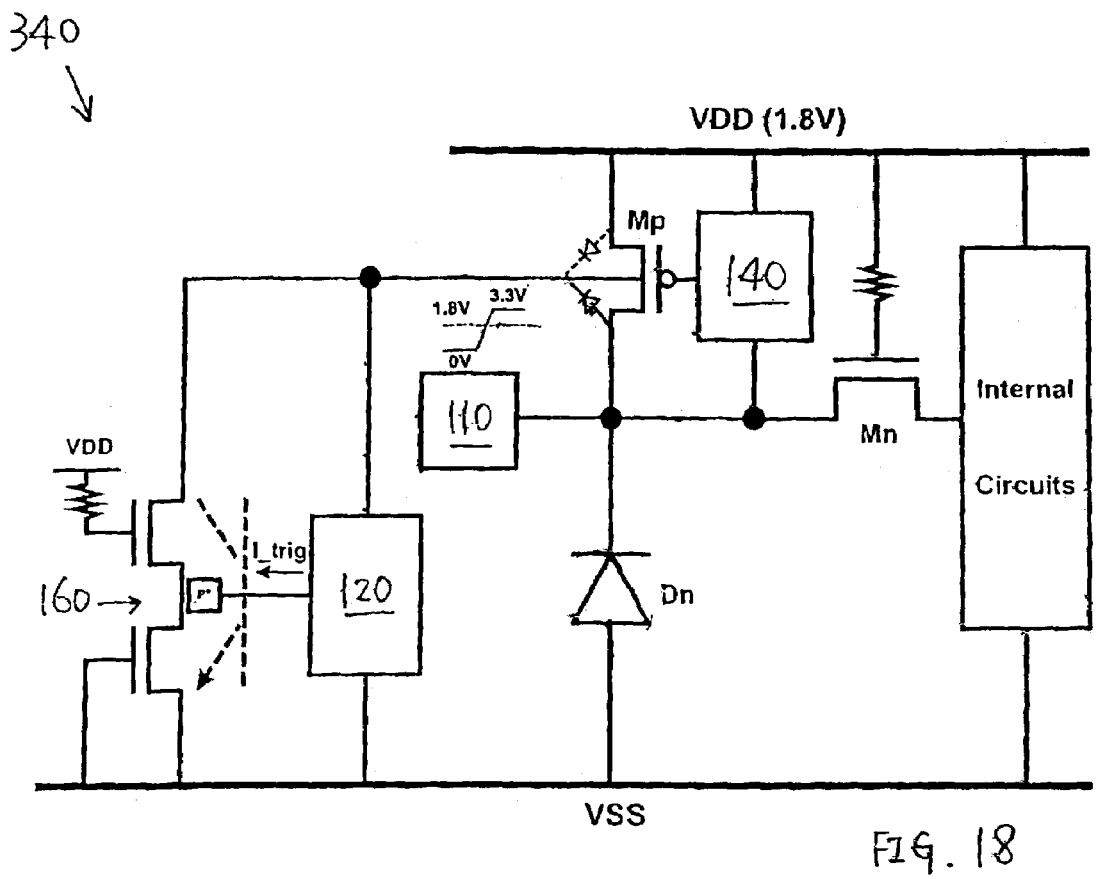
FIG. 18 is a circuit diagram for input-stage ESD protection in accordance with still another embodiment of the present invention.

FIG. 18 is a circuit diagram for input-stage ESD protection in accordance with still another embodiment of the present invention. Referring to FIG. 18, an ESD protection circuit 340 has the same structure as the circuit 320 shown in FIG. 17 except that a reverse-biased diode Dn replaces the first stacked NMOS 100. The diode Dn has a smaller area than the second stacked NMOS 160.

Figure 19:
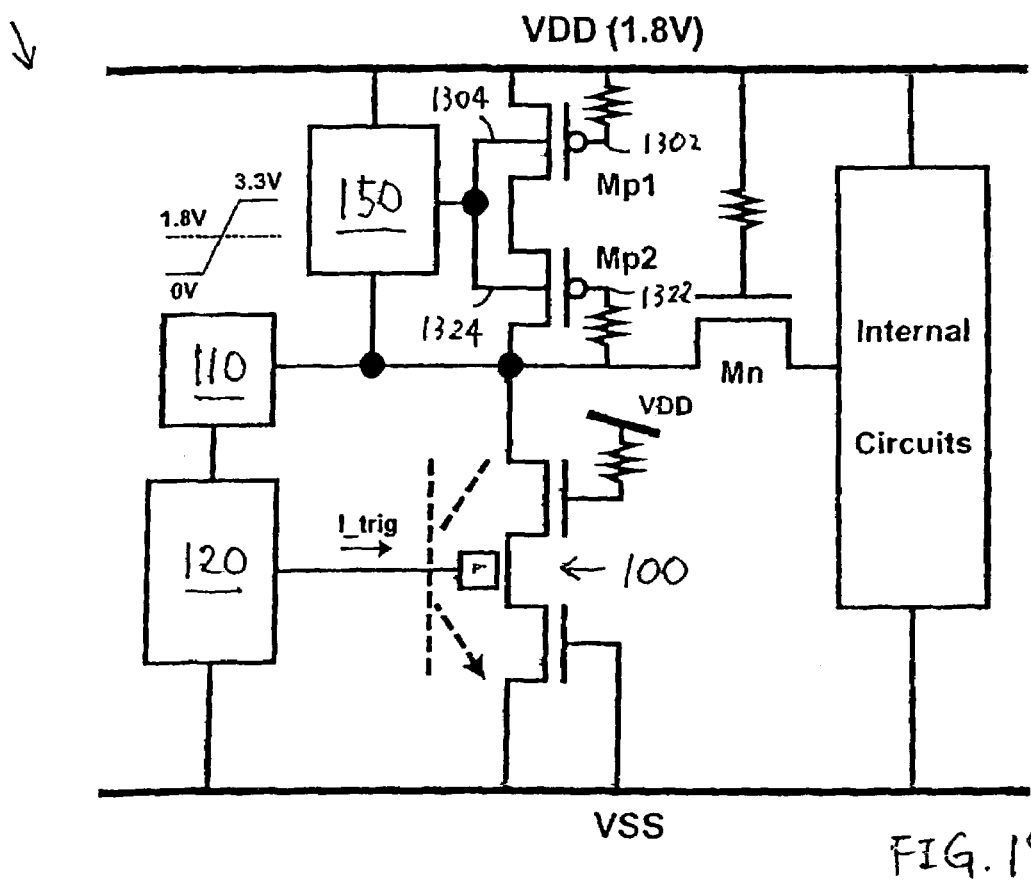
FIG. 19 is a circuit diagram for input-stage ESD protection in accordance with yet still another embodiment of the present invention.

FIG. 19 is a circuit diagram for input-stage ESD protection in accordance with still another embodiment of the present invention. Referring to FIG. 19, an ESD protection circuit 360 has the same structure as the circuit 280 shown in FIG. 15 except that a pair of PMOS transistors Mp1 and Mp2 connected in a cascode configuration for pad-to-VDD ESD protection replace the gate tracking circuit 140 and Mp in FIG. 15. Mp1 includes a gate terminal 1302 coupled to VDD and a body or N-well 1304 coupled to an N-well self-biased circuit 150. Mp2 includes a gate terminal 1322 coupled to an input pad 110 and a body or N-well 1324 coupled to the N-well self-biased circuit 150. Such a circuit arrangement prevents Mp1 and Mp2 from conducting any leakage current when an input signal is 0V or 3.3V.

Figure 20:
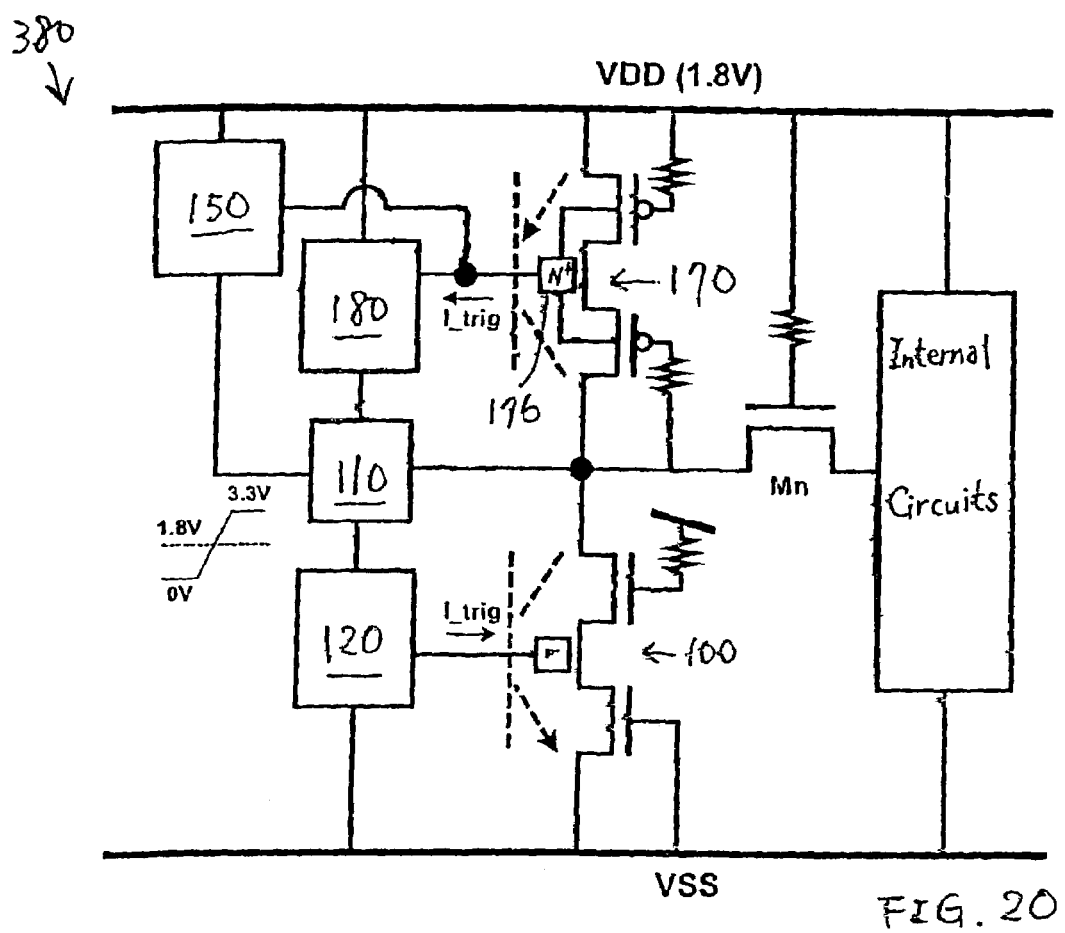
FIG. 20 is a circuit diagram for input-stage ESD protection in accordance with still another embodiment of the present invention.

FIG. 20 is a circuit diagram for input-stage ESD protection in accordance with still another embodiment of the present invention. Referring to FIG. 20, an ESD protection circuit 380 includes a stacked PMOS 170 to replace the pair of PMOS transistors Mp1 and Mp2, and a second ESD detection circuit 180 to trigger the n-type diffusion region 176 of the well-triggered stacked PMOS 170 during an ESD event. In other embodiments of the present invention, the Mp and gate tracking circuit 140 shown in FIGS. 16, 17 and 18 are replaced by the stacked PMOS 170 together with the second ESD detection circuit 180.

In addition to the input/output stage or VDD-to-VSS ESD protection, the stacked NMOS and PMOS devices consistent with the present invention are also useful for power-rail ESD protection, for example, VCC-to-VSS or VCC-to-VDD protection. Examples of the power-rail ESD protection are described in detail below.

Figure 21:
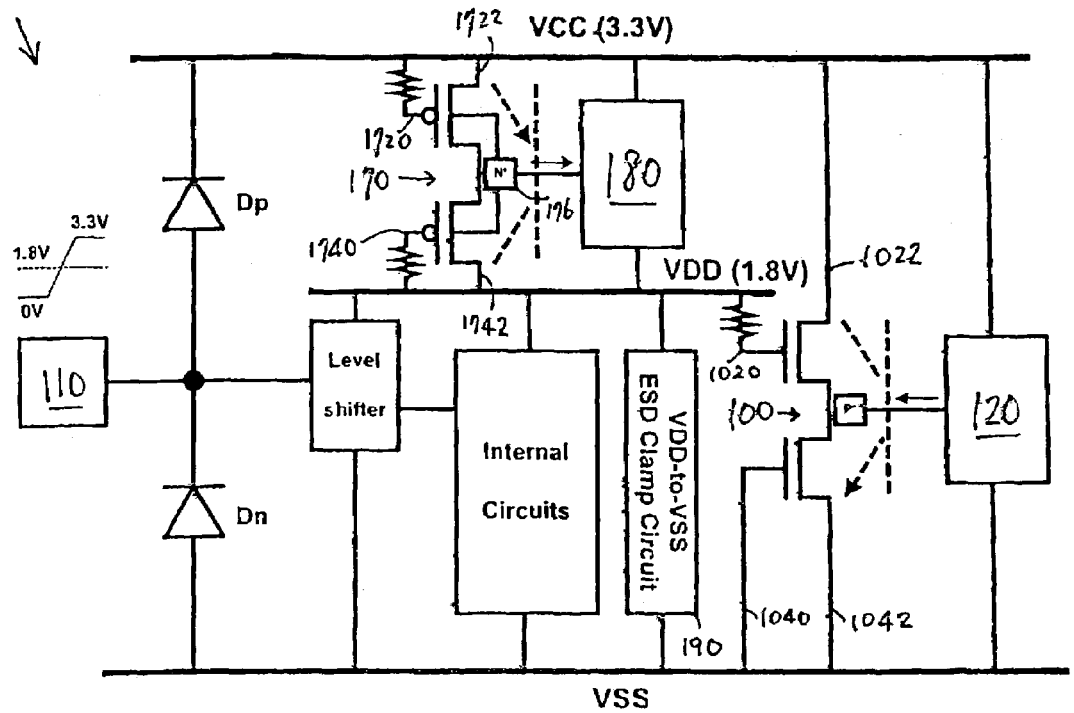
FIG. 21 is a circuit diagram for power-rail ESD protection in accordance with one embodiment of the present invention.

FIG. 21 is a circuit diagram for power-rail ESD protection in accordance with one embodiment of the present invention. Referring to FIG. 21, an ESD protection circuit 400 includes the well-triggered stacked PMOS 170 together with a first ESD detection circuit 180 for VCC (3.3V) to VDD (1.8V) ESD protection, and the substrate-triggered stacked NMOS 100 together with the second ESD detection circuit 120 for VCC to VSS ESD protection. The circuit 400 also includes a VDD-to-VSS ESD clamp circuit 190 that may be a substrate-triggered stacked NMOS or a well-triggered stacked PMOS having been explained by way of the above embodiments regarding the I/O stage protection.

The stacked NMOS 100 includes the top gate 1020 coupled to VDD, the drain terminal 1022 coupled to VCC, the bottom gate 1040 and the source terminal 1042 which are coupled to VSS. During normal operation, the stacked NMOS 100 is off and free from gate oxide overstress. When an ESD pulse is applied to the VCC line, the detection circuit 120 turns on and conducts an initial ESD current to trigger the stacked NMOS 100. As soon as the parasitic NPN bipolar transistor (shown in dotted line) in the stacked NMOS 100 is switched on, the ESD current is discharged through the parasitic NPN bipolar transistor to the VSS line.

The stacked PMOS 170 includes a top gate 1720 coupled to VCC and a bottom gate 1740 coupled to VDD. During normal operation, the stacked PMOS 170 is off and free from gate oxide overstress. When an ESD is applied from VCC to VDD, the detection circuit 180 turns on and conducts an initial ESD current from the VCC line through the P+/N-well junction of a parasitic PNP bipolar transistor (shown in dotted line) in the stacked PMOS 170 to the detection circuit 180. The initial ESD current flows into the N-well and generates a voltage drop across the P+/N-well junction. As soon as the voltage drop exceeds about 0.7V, the parasitic PNP bipolar transistor turns on and discharges the ESD current from VCC to VDD.

Figure 22:
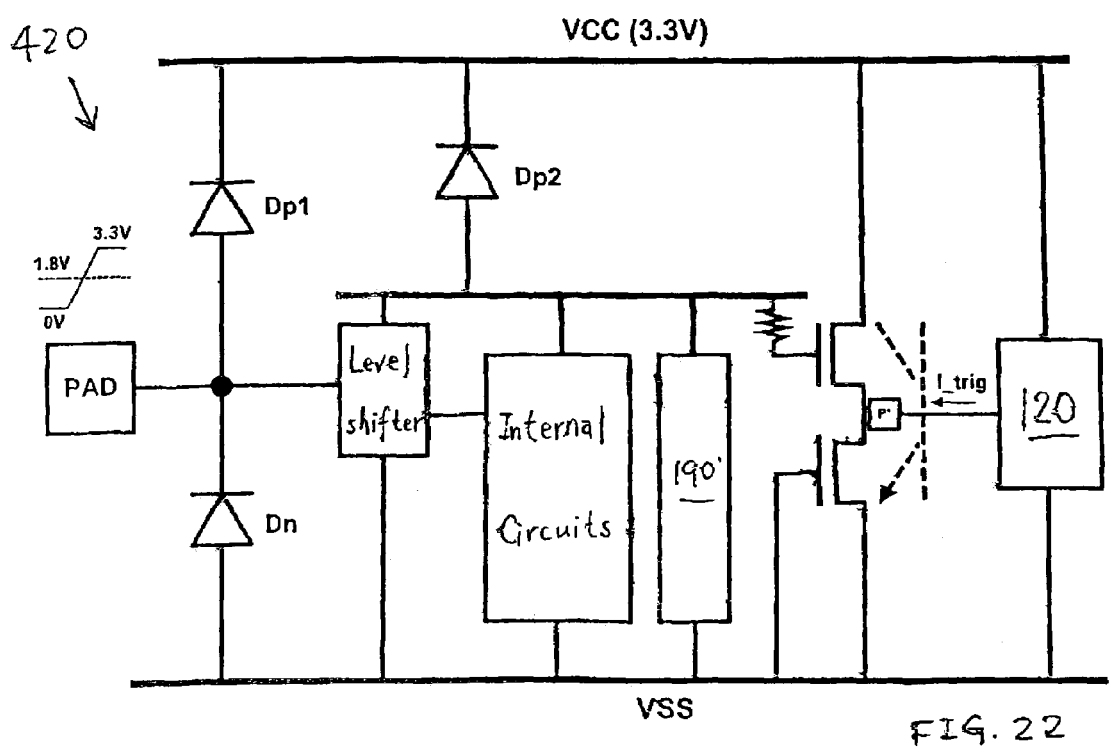
FIG. 22 is a circuit diagram for power-rail ESD protection in accordance with another embodiment of the present invention.

FIG. 22 is a circuit diagram for power-rail ESD protection in accordance with another embodiment of the present invention. Referring to FIG. 22, an ESD protection circuit 420 has the same structure as the circuit 400 shown in FIG. 21 except that a reverse-biased diode Dp2 replaces the stacked PMOS 170 and the ESD detection circuit 180 shown in FIG. 21.

Figure 23:
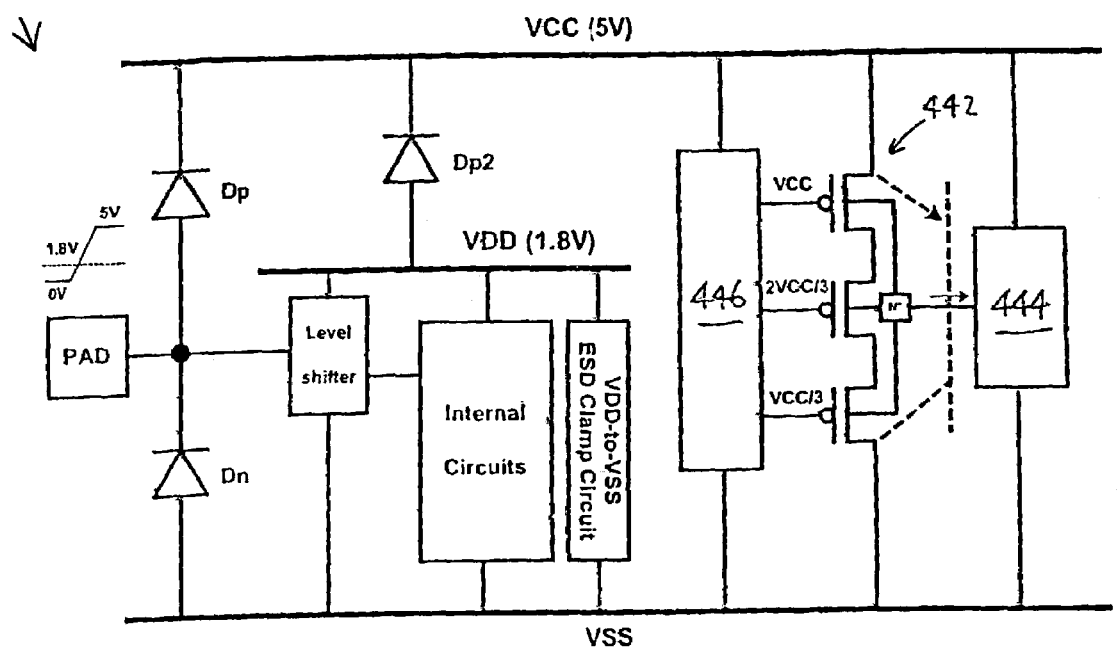
FIG. 23 is a circuit diagram for power-rail ESD protection in accordance with still another embodiment of the present invention.

FIG. 23 is a circuit diagram for power-rail ESD protection in accordance with yet another embodiment of the present invention. Referring to FIG. 23, an ESD protection circuit 440 includes a stacked PMOS 442, an ESD detection circuit 444 and a gate-bias circuit 446, all of which are coupled in parallel between VCC (5V) and VSS. The stacked PMOS 442 includes three PMOS transistors (not numbered) of which the gates are respectively biased at VCC, 2VCC/3 and VCC/3 by the bias circuit 446. During normal operation, the three PMOS transistors are off and free from gate oxide overstress. During an ESD event, the ESD detection circuit 444 becomes active and conducts an initial ESD current from the VCC line through the P+/N-well junction of a parasitic PNP transistor (shown in dotted line), formed in the stacked PMOS 442, to the ESD detection circuit 444. As long as the voltage drop across the P+/N-well junction exceeds about 0.7V, the parasitic PNP transistor turns on and discharges the ESD current from VCC to VSS.

The present invention therefore also provides a method for protecting a mixed voltage interface from electrostatic discharge. The method comprises providing a signal pad for receiving an electrostatic signal, providing a clamping device including, for example, at least two transistors connected in a cascode configuration, a first diffusion region of a first dopant type shared by two adjacent transistors, and a second diffusion region of a second dopant type formed in the first diffusion region, and providing a detection circuit responsive to the electrostatic signal for triggering a p-n junction between the first diffusion region and the second diffusion region of the clamping device.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection circuit device, comprising:
   at least two transistors connected in a cascode configuration;
   a first diffusion region of a first dopant type shared by two adjacent ones of the at least two transistors, wherein the first diffusion region serves as one of a drain and a source of each of the two adjacent transistors; and
   a second diffusion region of a second dopant type formed in the first diffusion region.

2. The device of claim 1, wherein each transistor has a gate structure and the second diffusion region overlaps a portion of the gate structure.

3. The device of claim 1, further comprising a third diffusion region of the first dopant type formed between the first and the second diffusion regions.

4. An integrated circuit device for electrostatic protection, comprising:
   a semiconductor substrate;
   a plurality of gates formed over the substrate;
   a first diffusion region of a first dopant type formed between two adjacent gates; and
   a plurality of second diffusion regions of a second dopant type formed in the first diffusion region, the second diffusion regions being connectable to an electrostatic discharge detection circuit, wherein at least one of the second diffusion regions is spaced apart from other ones of the second diffusion regions.

5. The device of claim 4, further comprising a third diffusion region of the first dopant type formed between the first and the second diffusion regions.

6. An integrated circuit device for electrostatic protection, comprising:
   a semiconductor substrate;
   a plurality of gates formed over the substrate;
   a first diffusion region of a first dopant type formed between two adjacent gates; and
   a plurality of second diffusion regions of a second dopant type formed in the first diffusion region, the second diffusion regions being connectable to an electrostatic discharge detection circuit, wherein at least one of the second diffusion regions is contiguous with another one of the second diffusion regions.

7. An integrated circuit for electrostatic discharge protection in a mixed voltage interface, comprising:
   a signal pad for receiving an electrostatic signal;
   a clamping device for providing electrostatic protection between a first voltage source and a second voltage source, the clamping device comprising:
      at least two transistors connected in a cascode configuration;
      a first diffusion region of a first dopant type shared by two adjacent ones of the at least two transistors, wherein the first diffusion region serves as one of a drain and a source of each of the two adjacent transistors; and
      a second diffusion region of a second dopant type formed in the first diffusion region; and
   a detection circuit responsive to the electrostatic signal for triggering the clamping device to direct the electrostatic signal to the second voltage source.

8. The device of claim 7, wherein the clamping device comprises a stacked NMOS.

9. The device of claim 7, wherein the clamping device comprises a stacked PMOS.

10. The device of claim 7, wherein the first voltage source comprises VDD and the second voltage source comprises VSS.

11. The device of claim 7, wherein the first voltage source comprises VCC and the second voltage source comprises VSS.

12. The device of claim 7, wherein the first voltage source comprises VCC and the second voltage source comprises VDD.

13. The device of claim 7, further comprising a transistor coupled between the first voltage source and the pad, the transistor having a gate and a body terminal.

14. The device of claim 13, further comprising a tracking device coupled to the gate of the transistor.

15. The device of claim 13, further comprising a biasing device coupled to the body terminal of the transistor.

16. The device of claim 13, wherein the clamping device comprises a first clamping device, the device further comprising a second clamping device of a same transistor type as the first clamping device, the second clamping device being coupled between the first voltage source and the second voltage source, and triggered by the detection circuit to direct the electrostatic signal to the second voltage source.

17. The device of claim 16, wherein the second clamping device comprises a terminal coupled to the body terminal of the transistor.

18. The device of claim 17, wherein the detection circuit is coupled between the pad and the second voltage source.

19. The device of claim 17, wherein the detection circuit is coupled between the body terminal of the transistor and the second voltage source.

20. The device of claim 7, wherein the clamping device comprises a first clamping device and the detection circuit comprises a first detection circuit, the device further comprising a second clamping device of an opposite transistor type to the first clamping device, the second clamping device coupled between the first voltage source and the pad, and triggered by a second detection circuit to direct the electrostatic signal to the pad.

21. The device of claim 20, wherein the first clamping device comprises a diode coupled between the pad and the second voltage source.

22. The device of claim 7, wherein the clamping device comprises a gate coupled to the first voltage source through a resistor.

23. The device of claim 13, wherein the detection circuit is coupled between the body terminal of the transistor and the second voltage source.

24. The device of claim 7, further comprising a pair of transistors serially connected between the first voltage source and the pad.

25. The device of claim 7, wherein the clamping device and the detection circuit are coupled in parallel between the first voltage source and the second voltage source.

26. The device of claim 25, further comprising a diode coupled between the first voltage source and a third voltage source.

27. The device of claim 26, wherein the clamping device includes a first gate coupled to the third voltage source.

28. The device of claim 25, further comprising a biasing circuit coupled between the first voltage source and the second voltage source.

29. The device of claim 28, wherein the clamping device comprises a first gate, a second gate and a third gate, and the biasing circuit is adapted to provide a first, a second and a third bias voltage to the first the second and the third gate of the clamping device, respectively.

30. A method for protecting a mixed voltage interface from electrostatic discharge, comprising:
providing a signal pad for receiving an electrostatic signal;
providing a clamping device comprising
at least two transistors connected in a cascode configuration,
a first diffusion region of a first dopant type shared by two adjacent ones of the at least two transistors, wherein the first diffusion region serves as one of a drain and a source of each of the two adjacent transistors, and
a second diffusion region of a second dopant type formed in the first diffusion region; and
providing a detection circuit responsive to the electrostatic signal for triggering a p-n junction between the first diffusion region and the second diffusion region of the clamping device.

31. A device, comprising:
means for receiving an electrostatic signal;
means for providing electrostatic protection between a first voltage source and a second voltage source, the means for providing electrostatic protection comprising:
at least two transistors connected in a cascode configuration;
a first diffusion region of a first dopant type shared by two adjacent one of the at least two transistors, wherein the first diffusion region serves as one of a drain and a source of each of the two adjacent transistors; and
a second diffusion region of a second dopant type formed in the first diffusion region; and
means for triggering the means for providing electrostatic protection to direct the electrostatic signal to the second voltage source.

32. The device of claim 31, wherein the means for providing electrostatic protection comprises a stacked NMOS.

33. The device of claim 31, wherein the means for providing electrostatic protection comprises a stacked PMOS.

34. The device of claim 31, wherein the first voltage source comprises VDD and the second voltage source comprises VSS.

35. The device of claim 31, wherein the first voltage source comprises VCC and the second voltage source comprises VSS.

36. The device of claim 31, wherein the first voltage source comprises VCC and the second voltage source comprises VDD.

37. The device of claim 31, further comprising:
a transistor coupled between the first voltage source and the means for receiving an electrostatic signal, the transistor having a gate and a body terminal.

38. The device of claim 37, further comprising:
means for tracking a gate voltage coupled to the gate of the transistor.

39. The device of claim 37, further comprising:
means for providing a bias voltage coupled to the body terminal of the transistor.

40. The device of claim 37, wherein the means for providing electrostatic protection comprises first means of providing electrostatic protection, the device further comprising second means of providing electrostatic protection of a same transistor type as the first means of providing electrostatic protection, the second means of providing electrostatic protection being coupled between the first voltage source and the second voltage source, and triggered by the means for triggering to direct the electrostatic signal to the second voltage source.

41. The device of claim 40, wherein the second means of providing electrostatic protection comprises a terminal coupled to the body terminal of the transistor.

42. The device of claim 41, wherein the means for triggering is coupled between the means for receiving an electrostatic signal and the second voltage source.

43. The device of claim 41, wherein the means for triggering is coupled between the body terminal of the transistor and the second voltage source.

44. The device of claim 31, wherein the means for providing electrostatic protection comprises first means for providing electrostatic protection and the means for triggering comprises first means for triggering, the device further comprising second means for providing electrostatic protection of an opposite transistor type to the first means for providing electrostatic protection, the second means for providing electrostatic protection coupled between the first voltage source and the means for receiving an electrostatic signal, and triggered by a second means for triggering to direct the electrostatic signal to the means for receiving an electrostatic signal.

45. The device of claim 31, wherein the means for providing electrostatic protection comprises a gate coupled to the first voltage source through a resistor.

46. The device of claim 37, wherein the means for triggering is coupled between the body terminal of the transistor and the second voltage source.

47. The device of claim 31, wherein the means for providing electrostatic protection and the means for triggering are coupled in parallel between the first voltage source and the second voltage source.

48. The device of claim 47, further comprising means for providing bias voltage coupled between the first voltage source and the second voltage source.

49. The device of claim 48, wherein the means for providing electrostatic protection comprises a first gate, a second gate and a third gate, and the means for providing bias voltage provides a first, a second and a third bias voltage to the first, the second and the third gate of the means for providing electrostatic protection, respectively.

50. A method, comprising:
connecting at least two transistors in a cascade configuration;
forming a first diffusion region of a first dopant type shared by two adjacent ones of the at least two transistors, wherein the first diffusion region serves as one of a drain and a source of each of the two adjacent transistors; and
forming a second diffusion region of a second dopant type in the first diffusion region.

51. The method of claim 50, wherein each transistor has a gate structure and the second diffusion region overlaps a portion of the gate structure.

52. The method of claim 50, further comprising:
forming a third diffusion region of the first dopant type between the first and the second diffusion regions.

53. A method, comprising:
forming a plurality of gates over a semiconductor substrate;
forming a first diffusion region of a first dopant type between two adjacent gates;
forming a plurality of second diffusion regions of a second dopant type in the first diffusion region, the plurality of second diffusion regions connectable to an electrostatic discharge detection circuit, wherein at least one of the second diffusion regions is spaced apart from other ones of the second diffusion regions.

54. The method of claim 51, further comprising:
forming a third diffusion region of the first dopant type formed between the first and the second diffusion regions.

55. A method, comprising:
forming a plurality of gates over a semiconductor substrate;
forming a first diffusion region of a first dopant type between two adjacent gates;
forming a plurality of second diffusion regions of a second dopant type in the first diffusion region, the plurality of second diffusion regions connectable to an electrostatic discharge detection circuit, wherein at least one of the second diffusion regions is contiguous with another one of the second diffusion regions.

56. The method of claim 55, further comprising:
forming a third diffusion region of the first dopant type formed between the first and the second diffusion regions.

* * * * *